(12) United States Patent
Kwak et al.

(10) Patent No.: US 9,336,866 B2
(45) Date of Patent: May 10, 2016

(54) STORAGE DEVICE AND A WRITE METHOD THEREOF

(71) Applicant: SAMSUNG ELECTRONICS CO., LTD., Suwon-si, Gyeonggi-do (KR)

(72) Inventors: DongHun Kwak, Gyeonggi-do (KR); Dongkyo Shim, Seoul (KR); Kitae Park, Gyeonggi-do (KR); Hyun-Wook Park, Gyeonggi-do (KR)

(73) Assignee: SAMSUNG ELECTRONICS CO., LTD., Suwon-Si, Gyeongg-Do (KR)

( * ) Notice: Subject to any disclaimer, the term of this patent is extended or adjusted under 35 U.S.C. 154(b) by 80 days.

(21) Appl. No.: 14/188,889

(22) Filed: Feb. 25, 2014

(65) Prior Publication Data

US 2015/0003152 A1    Jan. 1, 2015

(30) Foreign Application Priority Data

Jul. 1, 2013    (KR) .................. 10-2013-0076613

(51) Int. Cl.
| | |
|---|---|
| G11C 11/34 | (2006.01) |
| G11C 11/56 | (2006.01) |
| G11C 16/04 | (2006.01) |
| G11C 16/10 | (2006.01) |
| G11C 16/34 | (2006.01) |

(52) U.S. Cl.
CPC ........ *G11C 11/5628* (2013.01); *G11C 16/0483* (2013.01); *G11C 16/10* (2013.01); *G11C 16/349* (2013.01); *G11C 16/3459* (2013.01)

(58) Field of Classification Search
USPC ............. 365/185.03, 185.09, 185.11, 185.17, 365/185.18, 185.19, 185.24, 185.29, 185.33
See application file for complete search history.

(56) References Cited

U.S. PATENT DOCUMENTS

| | | | |
|---|---|---|---|
| 5,696,717 A | 12/1997 | Koh | |
| 5,838,729 A | 11/1998 | Hu et al. | |
| 6,145,068 A | 11/2000 | Lewis | |
| 6,522,580 B2 | 2/2003 | Chen et al. | |
| 6,643,188 B2 * | 11/2003 | Tanaka et al. | ............ 365/185.03 |
| 7,173,859 B2 | 2/2007 | Hemink | |
| 7,221,592 B2 | 5/2007 | Nazarian | |
| 7,391,651 B2 | 6/2008 | Chen | |
| 7,916,534 B2 | 3/2011 | Shimizu et al. | |
| 8,127,200 B2 | 2/2012 | Sharon et al. | |
| 8,355,280 B2 | 1/2013 | Yoon et al. | |
| 8,411,502 B2 * | 4/2013 | Yoon et al. | ............... 365/185.03 |
| 8,812,933 B2 * | 8/2014 | Joo et al. | .................. 365/185.09 |
| 8,902,651 B2 * | 12/2014 | Kwak et al. | .............. 365/185.03 |
| 9,053,819 B2 * | 6/2015 | Kamei et al. | |
| 9,076,534 B2 * | 7/2015 | Yoon et al. | |
| 2011/0205817 A1 | 8/2011 | Yoon et al. | |
| 2013/0145234 A1 | 6/2013 | Yoon et al. | |

* cited by examiner

*Primary Examiner* — Trong Phan
(74) *Attorney, Agent, or Firm* — F. Chau & Associates, LLC

(57) ABSTRACT

A write method of a storage device includes determining whether to perform a coarse program operation based on information about memory cells of a memory device, in response to a determination that the coarse program operation is to be performed, programming data in the memory device by performing the coarse program operation and a fine program operation, and in response to a determination that the coarse program operation is not to be performed, programming data in the memory device by performing the fine program operation.

26 Claims, 23 Drawing Sheets

Fig. 13

| WL | PGM Type | Page Address | | | | |
|---|---|---|---|---|---|---|
| | | SSL1 | SSL2 | SSL3 | SSL4 | |
| 1 | Coarse PGM | 0 (A) | 1 | 2 | 3 | ① |
| | Fine PGM | 8 | 9 | 10 | 11 | ③ |
| 2 | Coarse PGM | 4 | 5 | 6 | 7 | ② |
| | Fine PGM | 16 | 17 | 18 | 19 | ⑤ |
| 3 | Coarse PGM | 12 | 13 | 14 | 15 (B) | ④ |
| | Fine PGM | 24 | 25 | 26 | 27 | ⑦ |
| 4 | Coarse PGM | 20 | 21 | 22 | 23 | ⑥ |
| | Fine PGM | 32 | 33 | 34 | 35 | ⑧ |

STORAGE DEVICE AND A WRITE METHOD THEREOF

CROSS-REFERENCE TO RELATED APPLICATION

This application claims priority under 35 U.S.C. §119 to Korean Patent Application No. 10-2013-0076613 filed Jul. 1, 2013, in the Korean Intellectual Property Office, the disclosure of which is incorporated by reference herein in its entirety.

BACKGROUND

1. Technical Field

The inventive concept relates to a storage device and a write method thereof.

2. Discussion of the Related Art

Semiconductor memory devices may be volatile or nonvolatile. A nonvolatile semiconductor memory device can retain data stored therein even when not powered. The nonvolatile memory device may be permanent or reprogrammable. The nonvolatile memory device may be used for user data, program, and microcode storage in a wide variety of applications in the computer, avionics, telecommunications, and consumer electronics industries.

A method of reprogramming memory cells of a reprogrammable nonvolatile memory device may be used to reduce cell coupling. For example, in a reprogramming method, a plurality of program operations is performed to narrow a threshold voltage distribution of data values to be stored. In other words, the reprogramming method may include a coarse program operation and a fine program operation. The coarse program operation may form a rough threshold voltage distribution. The fine program operation may finely narrow a threshold voltage distribution formed by the coarse program operation.

Example reprogramming methods are disclosed in U.S. Pat. Nos. 8,355,280 and 8,411,502 and U.S. Patent Application Publication Nos. 2011/0205817 and 2013/0145234, the disclosures of which are incorporated by reference herein in their entireties.

SUMMARY

An exemplary embodiment of the inventive concept provides a write method of a storage device, comprising: determining whether to perform a coarse program operation based on information about memory cells of a memory device, in response to a determination that the coarse program operation is to be performed, programming data in the memory device by performing the coarse program operation and a fine program operation, and in response to a determination that the coarse program operation is not to be performed, programming data in the memory device by performing the fine program operation.

The information about memory cells of the memory device includes program/erase cycle information, wear-leveling information, or information indicating whether a memory cell is programmed.

The determination is made by a memory controller.

The data programmed in the coarse program operation is provided via a first signal line to a buffer area.

The buffer area is included in the memory device, a memory controller, or is separate from the memory device and the memory controller.

The data programmed in the fine program operation is provided via a second signal line to a memory area of the memory device.

A memory controller provides the memory device with an instruction whether to perform the coarse program operation and the fine program operation, or perform only the fine program operation.

The memory device is a nonvolatile memory.

The nonvolatile memory has a three-dimensional vertical array structure.

The determination is made in response to a write request.

A number of program states in the coarse program operation is based on a program/erase cycle number.

A range of a threshold voltage distribution near a lower program state is narrower than a range of a threshold voltage distribution near an upper program stage in the coarse program operation.

An exemplary embodiment of the inventive concept provides a write method of a storage device, comprising: receiving a write request at a memory controller; determining, at the memory controller, whether to perform a coarse program operation based on information about memory cells corresponding to the write request; wherein when the information about the memory cells is between an initial state and a first threshold, the coarse program operation is determined not to be performed; and when the information about the memory cells is between the first threshold and a second threshold, the coarse program operation is determined to be performed and data is programmed in the memory cells by performing the coarse program operation and a fine program operation.

The information about memory cells of the memory device includes program/erase cycle information, wear-leveling information, or information indicating whether a memory cell is programmed.

The information about the memory cells indicates a program/erase cycle number of the memory cells.

The program/erase cycle number of the first threshold is less than the program/erase cycle number of the second threshold.

Data corresponding to an upper portion of a program state is programmed during the coarse program operation and data corresponding to a lower portion of a program state is not programmed during the coarse program operation.

When the information about the memory cells exceeds the second threshold, the coarse program operation is determined to be performed and data is programmed in the memory cells by performing the coarse program operation.

The program/erase cycle number of the memory cells is greater than the second threshold when the information about the memory cells exceeds the second threshold.

Data corresponding to all program states is programmed during the coarse program operation performed when the program/erase cycle number of memory cells exceeds the second threshold.

A range of a threshold voltage distribution near a lower program state is narrower than a range of a threshold voltage distribution near an upper program stage in the coarse program operation.

An exemplary embodiment of the inventive concept provides a write method of a storage device, comprising: receiving a write request for an address at a memory controller; determining, at the memory controller, a type of coarse program operation to be performed on a memory cell associated with the address, wherein the type of coarse program operation is based on an expected time of start of a fine program operation after execution of the coarse program operation;

and outputting, from the memory controller to a memory device, an instruction to perform the determined type of coarse program operation.

Threshold voltage distributions in a first type coarse program operation are narrow when the expected time is short and threshold voltage distributions in a second type coarse program operation are wide when the expected time is long.

An exemplary embodiment of the inventive concept provides a write method of a storage device, comprising: determining a type of coarse program operation to be performed based on information about memory cells of a memory device; and in response to determining the type of coarse program operation to be performed, programming data in the memory device by performing the determined type of coarse program operation and a fine program operation.

A number of program states formed in the coarse program operation increases as a program/erase cycle increases.

A range of a threshold voltage distribution near a lower program state is narrower than a range of a threshold voltage distribution near an upper program state in the coarse program operation.

Program states of the coarse program operation are divided into a plurality of groups.

The program states are grouped according to ranges of their threshold voltage distributions.

An increment of a voltage level of a program pulse in the coarse program operation is reduced.

A duration between program pulses in the coarse program operation is different.

BRIEF DESCRIPTION OF THE DRAWINGS

The above and other features of the inventive concept will become more apparent by describing in detail exemplary embodiments thereof with reference to the accompanying drawings, in which:

FIG. 13 is a diagram for describing an expected time of start of a fine program operation using an address scramble according to an exemplary embodiment of the inventive concept;

DETAILED DESCRIPTION OF THE EMBODIMENTS

Figure 1:
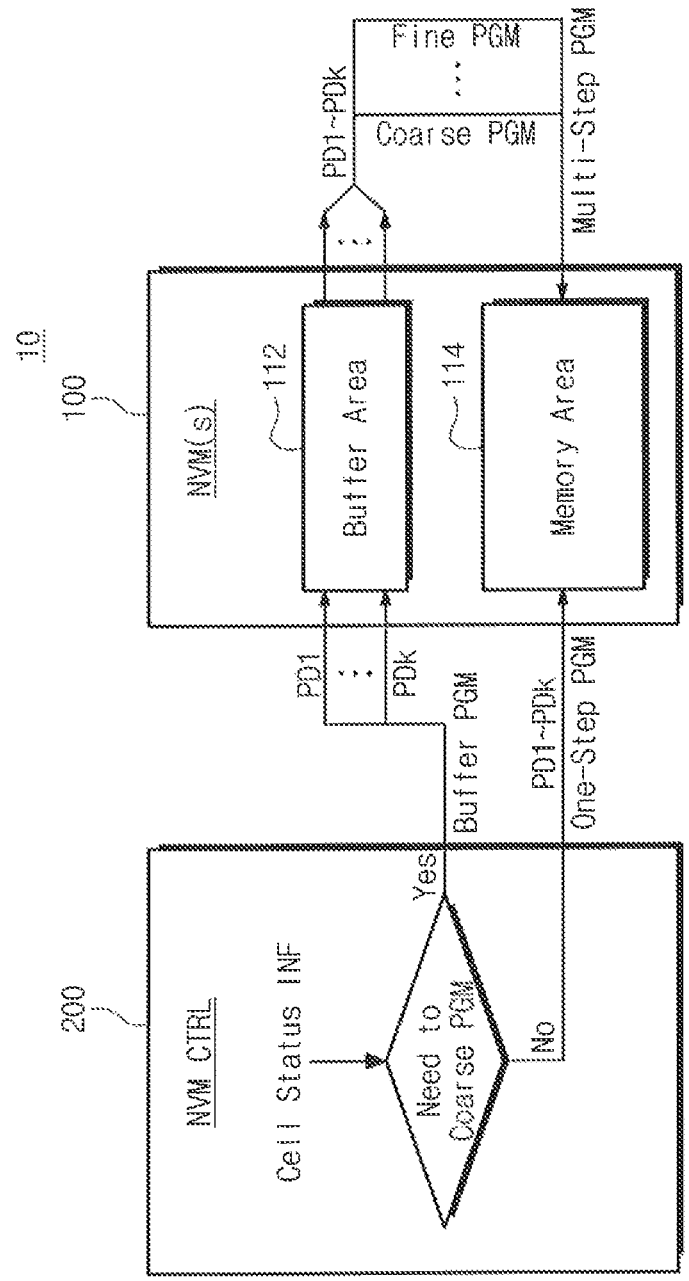
FIG. 1 is a block diagram illustrating a storage device according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited only to the illustrated embodiments. Like reference numerals may denote like elements throughout the attached drawings and written description.

I As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

A storage device according to an exemplary embodiment of the inventive concept may be configured to determine whether to perform a coarse program operation or a type of coarse program operation, based on cell status information.

FIG. 1 is a block diagram illustrating a storage device according to an exemplary embodiment of the inventive concept. Referring to FIG. 1, a storage device 10 may include at least one nonvolatile memory device NVM(s) 100 and a memory controller NVM CTRL 200 for controlling the at least one nonvolatile memory device 100.

The nonvolatile memory device 100 may perform a multi-bit program operation in a reprogramming method. The nonvolatile memory device 100 may include a buffer area 112 and a memory area 114.

The buffer area 112 may be an area where a buffer program operation Buffer PGM is carried out when a program operation is performed in the reprogramming method. Here, the buffer program operation may enable plural pages of data PD1 to PDk (k being an integer of 2 or more) to be stored at a plurality of pages for buffering. In exemplary embodiments of the inventive concept, the buffer area 112 may include a single-level cell (SLC) memory, and the buffer program operation may be a 1-bit program operation or an N-bit program operation (N being an integer of 2 or more).

The memory area 114 may be an area where a one-step program operation One-Step PGM or a multi-step program operation Multi-Step PGM is performed. At the one-step program operation, plural pages of data PD1 to PDk may be stored at a page without using a reprogramming method. At the multi-step program operation, plural pages of data PD1 to PDk may be stored at a page using the reprogramming method.

In exemplary embodiments of the inventive concept, the memory area 114 may be formed of a multi-level cell (MLC) or a triple-level cell (TLC) memory and perform an M-bit program operation (M being an integer). Here, M may be equal to or more than N. For example, the buffer area 112 may perform a 1-bit program operation and the memory area 114 may perform a multi-bit program operation (e.g., 2 or more bits).

The multi-step program operation may include a coarse program operation Coarse PGM and a fine program operation Fine PGM. Assuming that the same data is programmed, a width of a threshold voltage distribution formed by the fine program operation may be narrower than that formed by the coarse program operation.

Further, the multi-step program operation may include at least one coarse program operation and at least one fine program operation.

The nonvolatile memory device 100 may include the memory area 114 where data is stored using one of the one-step program operation and the multi-step program operation.

In response to a write request of an external device, the memory controller 200 may determine whether to perform a coarse program operation Need to Coarse PGM based on status information of a memory cell to be programmed Cell Status INF. Here, the status information may include program/erase (P/E) cycle information, wear-leveling information, and information indicating whether the memory cell is programmed. However, the inventive concept is not limited thereto.

In exemplary embodiments of the inventive concept, when a P/E cycle value is smaller than a predetermined value (e.g., when a level of deterioration of a memory cell is relatively low), the memory controller 200 may not perform a coarse program operation No. In other words, data may be stored in the memory area 114 by the one-step program operation. On the other hand, when a P/E cycle value is larger than a predetermined value (e.g., when a level of deterioration of a memory cell is relatively high), the memory controller 200 may perform the coarse program operation Yes. In other words, data may be stored in the memory area 114 by the multi-step program operation.

In exemplary embodiments of the inventive concept, the memory controller 200 may perform a multi-bit program operation as a default reprogramming method. When a P/E cycle value is smaller than a predetermined value, the memory controller 200 may perform the multi-bit program operation without using a reprogramming method.

The storage device 10 according to an exemplary embodiment of the inventive concept may determine whether to perform the multi-bit program operation using the reprogramming method, based on cell status information (e.g., P/E cycle information, wear-leveling information, etc.).

Figure 2:
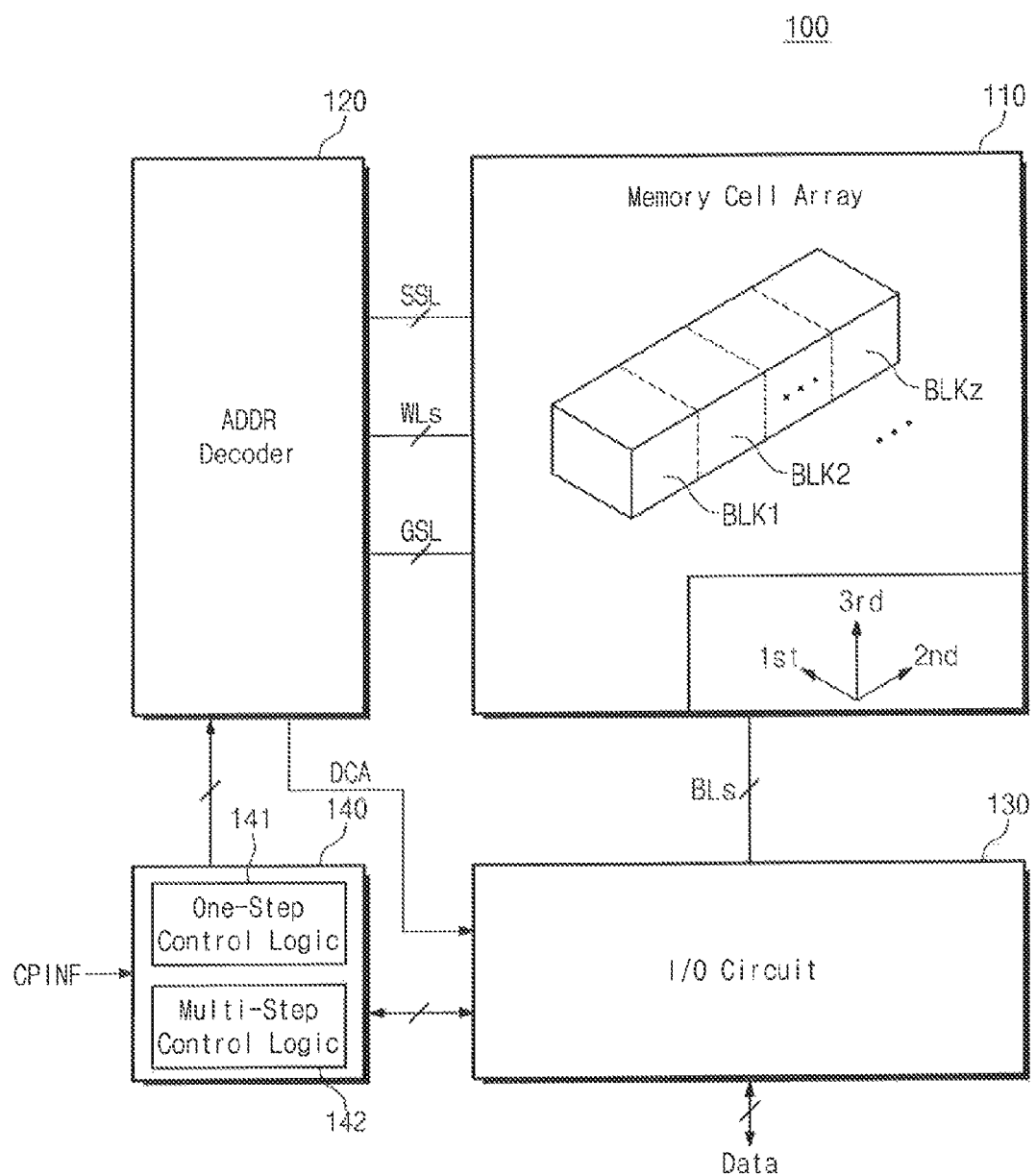
FIG. 2 is a block diagram illustrating a nonvolatile memory device according to an exemplary embodiment of the inventive concept.

FIG. 2 is a block diagram illustrating a nonvolatile memory device according to an exemplary embodiment of the inventive concept. Referring to FIG. 2, a nonvolatile memory device 100 may include a memory cell array 110, an address decoder 120, an input/output circuit 130, and control logic 140.

The nonvolatile memory device 100 may be a NAND flash memory device, for example. However, the nonvolatile memory device 100 is not limited to the NAND flash memory device. For example, the inventive concept may be applied to a vertical NAND flash memory device, a NOR flash memory device, a Resistive Random Access Memory (RRAM) device, a Phase-Change Random Access Memory (PRAM) device, a Magnetroresistive Random Access Memory (MRAM) device, a Ferroelectric Random Access Memory (FRAM) device, a Spin Transfer Torque Random Access Memory (STT-RAM) device, and the like.

Further, the nonvolatile memory device 100 can have a three-dimensional array structure. In this case, the nonvolatile memory device 100 may be a vertical NAND flash memory device. The inventive concept may be applied to a Charge Trap Flash (CTF) memory device including a charge storage layer formed of an insulation film as well as a flash memory device including a charge storage layer formed of a conductive floating gate. Below, the inventive concept will be described under the condition that the nonvolatile memory device 100 is a vertical NAND flash memory device.

The memory cell array 110 may be connected to the address decoder 120 through word lines WL, at least one string selection line SSL, and at least one ground selection line GSL. The memory cell array 110 may be connected to the input/output circuit 130 through bit lines BL. The memory cell array 110 may include a plurality of memory blocks BLK1 to BLKz (z being an integer of 2 or more).

Each of the memory blocks BLK1 to BLKz may include a plurality of strings which are arranged along a first direction 1st and a second direction 2nd different from the first direction and along a third direction 3rd (e.g., a direction perpendicular to a plane formed by the first and second directions) to have a three-dimensional structure. Here, each string may include at least one string selection transistor, a plurality of memory cells, and at least one ground selection transistor stacked on a substrate. Each memory cell may store at least one data bit.

At least one of the memory blocks BLK1 to BLKz may be used as the buffer area 112 illustrated in FIG. 1, and the remaining memory blocks may be used as the memory area 114 illustrated in FIG. 1. In exemplary embodiments of the inventive concept, at least one memory block assigned to the buffer area 112 may be fixed. In exemplary embodiments of the inventive concept, a memory block assigned to the buffer area 112 may be changed by the memory controller 200 illustrated in FIG. 1. Alternatively, a part of each memory block may be used as the buffer area 112, and the remaining part or parts thereof may be used as the memory area 114.

The address decoder 120 may be connected to the memory cell array 110 through the word lines WL, the at least one string selection line SSL and the at least one ground selection line GSL. The address decoder 120 may select the word lines WL, the string selection line SSL and the ground selection line GSL using a decoded row address. The address decoder 120 may decode a column address of an input address. The decoded column address DCA may be provided to the input/output circuit 130. In exemplary embodiments of the inventive concept, the address decoder 120 may include a row decoder, a column decoder, an address buffer, and so on.

The input/output circuit 130 may be connected to the memory cell array 110 through the bit lines BL. The input/output circuit 130 may be configured to receive the decoded column address DCA from the address decoder 120. The input/output circuit 130 may select the bit lines BL using the decoded column address DCA.

The input/output circuit 130 may receive data from an external device (e.g., a memory controller) to store it in the memory cell array 110. The input/output circuit 130 may read data from the memory cell array 110 to output it to the external device. Further, the input/output circuit 130 may read data from a first area of the memory cell array 110 and store it in a second area of the memory cell array 110. For example, the input/output circuit 130 may be configured to perform a copy-back operation.

The control logic 140 may control an overall operation of the nonvolatile memory device 100 including a program operation, a read operation, an erase operation, and so on. The control logic 140 may operate in response to control signals or commands provided from the external device.

The control logic 140 may include one-step control logic 141 and multi-step control logic 142. The one-step control logic 141 may control internal components (e.g., the address buffer 120, the input/output circuit 130, etc.) to perform a multi-bit program operation without using a reprogramming method. The multi-step control logic 142 may control the internal components to perform the multi-bit program operation using the reprogramming method.

In exemplary embodiments of the inventive concept, the control logic 140 may activate one of the one-step control logic 141 and the multi-step control logic 142 based on coarse program operation information CPINF (also referred to as coarse program operation signal) provided from the memory controller 200.

The nonvolatile memory device 100 according to an exemplary embodiment of the inventive concept may perform a one-step program operation or a multi-step program operation, based on the coarse program operation information CPINF.

Figure 3:
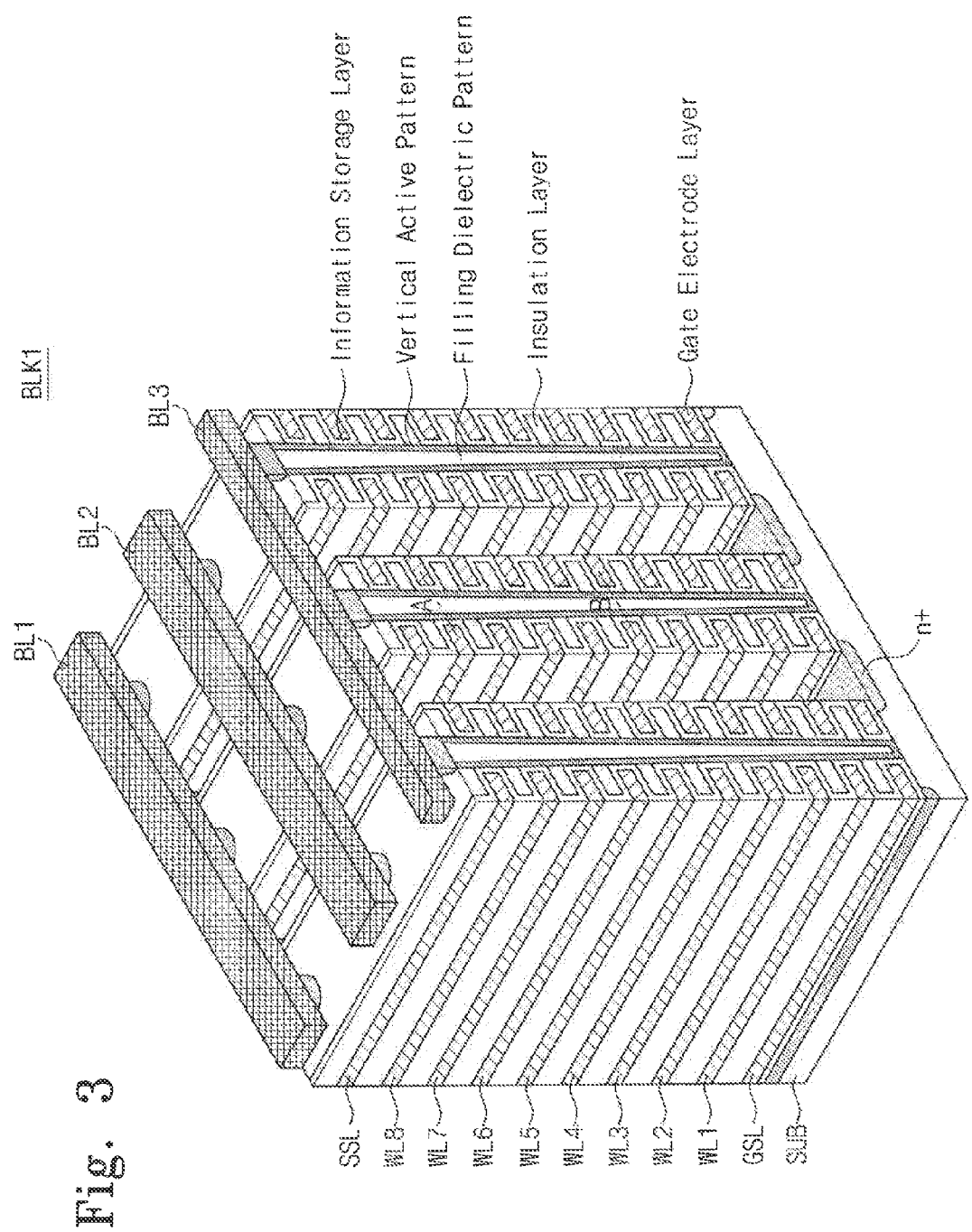
FIG. 3 is a perspective view illustrating a memory block according to an exemplary embodiment of the inventive concept.

FIG. 3 is a perspective view illustrating a memory block according to an exemplary embodiment of the inventive concept. Referring to FIG. 3, a memory block BLK1 may be formed in a direction perpendicular to a substrate SUB. An n+ doping region may be formed at the substrate SUB.

A gate electrode layer and an insulation layer may be deposited on the substrate SUB. A charge storage layer (or information storage layer) may be formed between the gate electrode layer and the insulation layer.

If the gate electrode layer and the insulation layer are patterned in a vertical direction, a V-shaped pillar may be formed. The pillar may be connected with the substrate SUB through the gate electrode layer and the insulation layer. An outer portion of the pillar may be formed of a channel semiconductor as a vertical active pattern, and an inner portion thereof may be formed of an insulation material such as silicon oxide as a filling dielectric pattern.

The gate electrode layer of the memory block BLK1 may be connected with a ground selection line GSL, a plurality of word lines WL1 to WL8, and a string selection line SSL. The pillars of the memory block BLK1 may be connected with a plurality of bit lines BL1 to BL3. In FIG. 3, there is illustrated an example where one memory block BLK1 has two selection lines SSL and GSL, eight word lines WL1 to WL8, and three bit lines BL1 to BL3. However, the inventive concept is not limited thereto.

Figure 4:
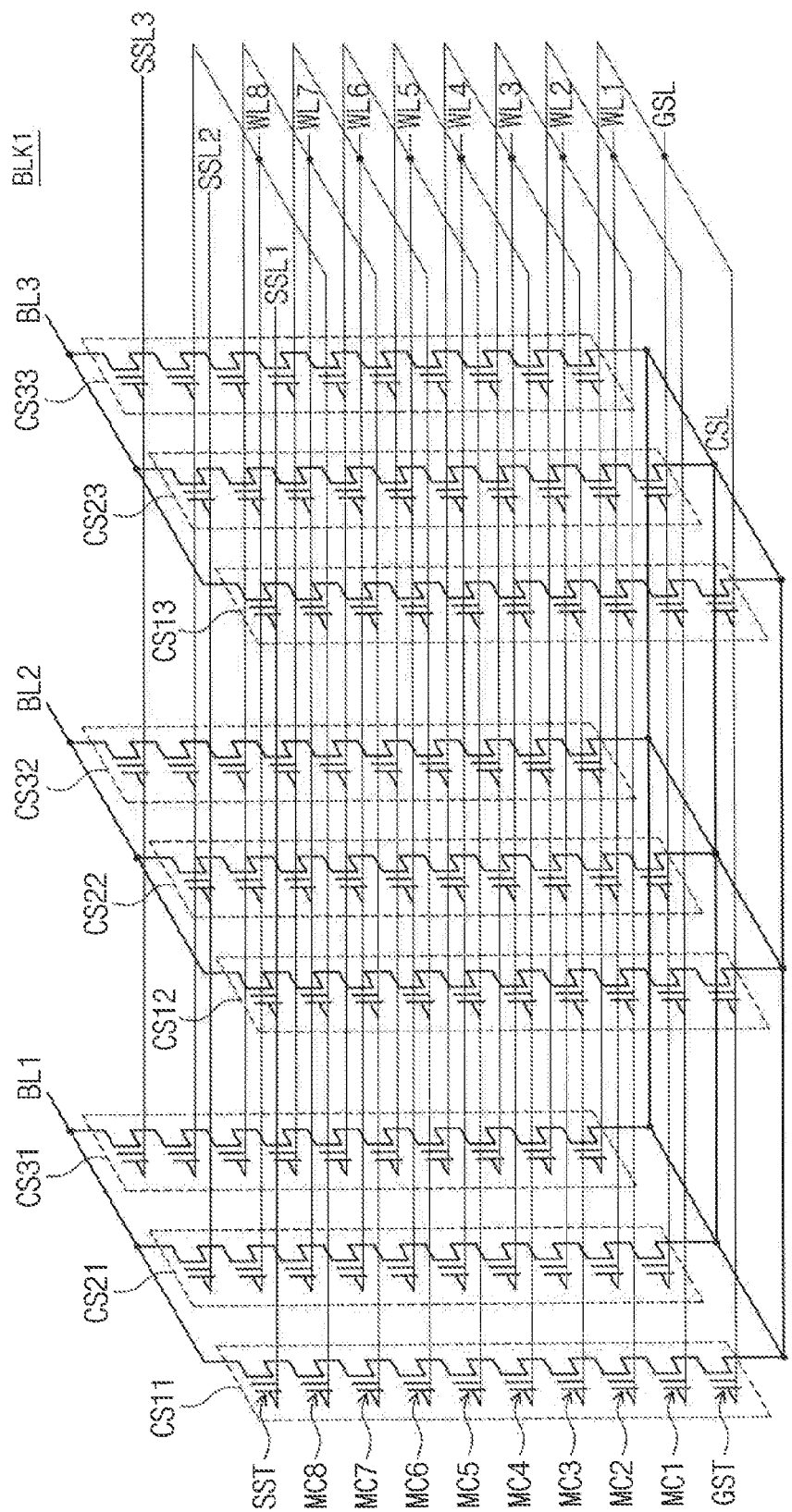
FIG. 4 is a circuit diagram illustrating an equivalent circuit of a memory block illustrated in FIG. 3, according to an exemplary embodiment of the inventive concept.

FIG. 4 is a circuit diagram illustrating an equivalent circuit of a memory block illustrated in FIG. 3, according to an exemplary embodiment of the inventive concept. Referring to FIG. 4, cell strings CS11 to CS33 may be connected between bit lines BL1 to BL3 and a common source line CSL. Each cell string (e.g., CS11) may include a string selection transistor SST, a plurality of memory cells MC1 to MC8, and a ground selection transistor GST.

The string selection transistors SST may be connected with a string selection line SSL. The string selection line SSL may be divided into first to third string selection lines SSL1 to SSL3. The ground selection transistors GST may be connected with a ground selection line GSL. In each cell string, the string selection transistor SST may be connected with a bit line, and the ground selection transistor GST may be connected with the common source line CSL.

In each cell string, the memory cells MC1 to MC8 may be connected with corresponding word lines WL1 to WL8, respectively. A group of memory cells connected with a word line and programmed at the same time may be referred to as a page. The memory block BLK1 may include a plurality of pages. One word line may be connected with a plurality of pages. Referring to FIG. 4, a word line (e.g., WL4) spaced apart from the common source line CSL by a predetermined distance may be connected in common with three pages.

Each memory cell may store 1-bit data or two or more bits of data. A memory cell storing 1-bit data may be referred to as an SLC or a single-bit cell. A memory cell storing two or more bits of data may be referred to as an MLC or a multi-bit cell. In a 2-bit MLC, two pages of data may be stored at a physical page. Thus, six pages of data may be stored at memory cells connected with the word line WL4.

A three-dimensional nonvolatile memory device may be implemented by a CTF. In this case, an initial verify shift (IVS) phenomenon may occur in which charges trapped in a programmed CTF are redistributed and leaked over time. Reprogramming may be performed to overcome deterioration resulting from this phenomenon.

Figure 5:
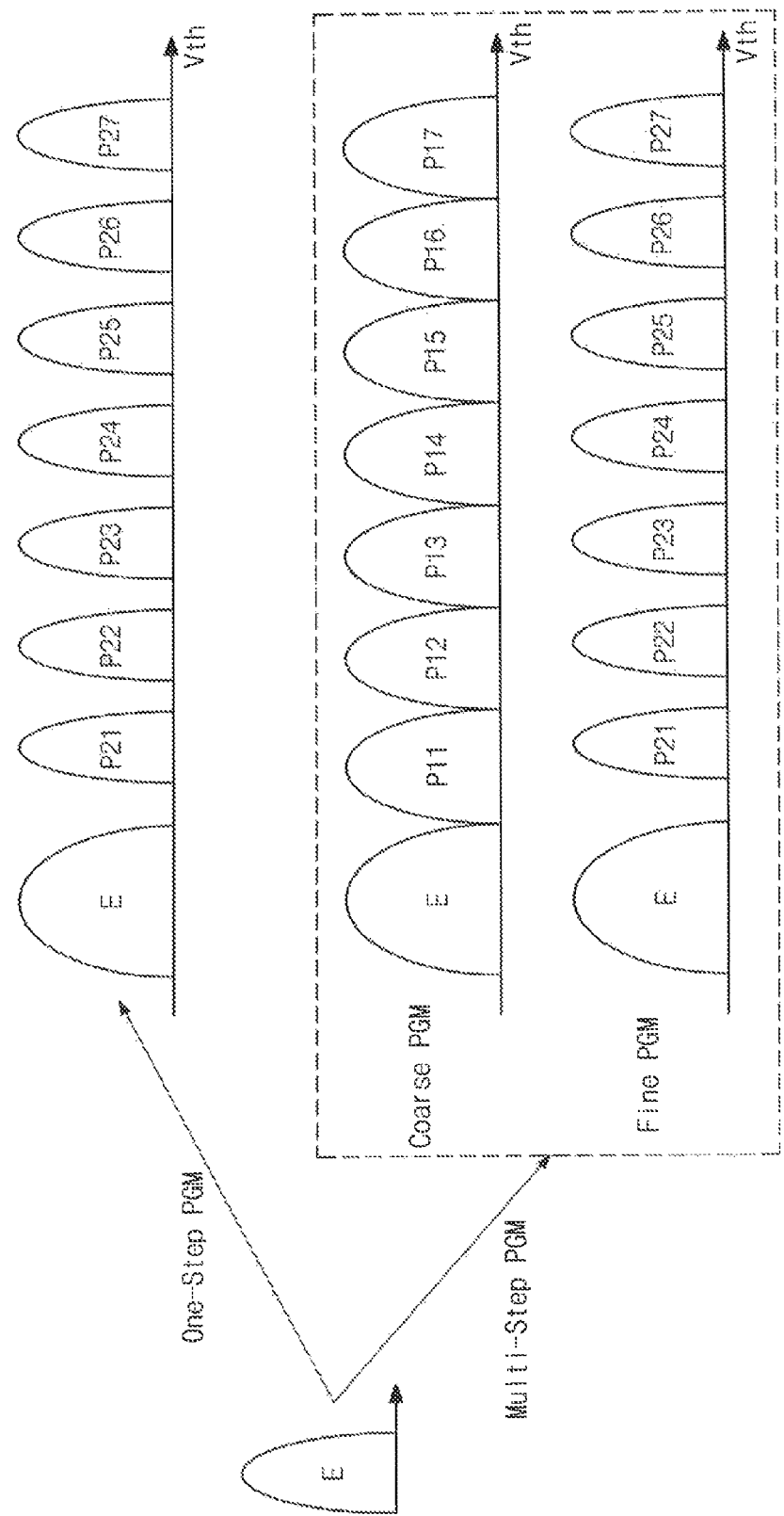
FIG. 5 is a diagram illustrating threshold voltage distributions of programmed memory cells in a memory area illustrated in FIG. 1 according to an exemplary embodiment of the inventive concept.

FIG. 5 is a diagram illustrating threshold voltage Vth distributions of programmed memory cells in the memory area 114 illustrated in FIG. 1 according to an exemplary embodiment of the inventive concept. For ease of description, it is assumed that a 3-bit program operation is applied to a memory cell. With this assumption, the memory cell may be programmed to have one of eight threshold voltage distributions.

Referring to FIG. 5, a memory cell may be programmed to have one of an erase state E and program states P21 to P27 in a one-step program operation. Here, the program states P21 to P27 may be final states for storing 3-bit data.

With a multi-step program operation using a reprogramming method, a coarse program operation may be performed, and then, a fine program operation may be performed. Here, the coarse and fine program operations may be 3-bit program operations.

In the coarse program operation (of the multi-step program operation), threshold voltage distributions may be formed to correspond to program states P11 to P17, respectively. In the fine program operation (of the multi-step program operation), threshold voltage distributions may be formed to correspond to program states P21 to P27, respectively.

A width of a threshold voltage distribution of at least one of the program states P21 to P27 formed by the fine program operation may be narrower than that formed by the coarse program operation.

For ease of description, in FIG. 5, there is illustrated an example of a two-step program operation including a coarse programming step and a fine programming step. However, the inventive concept is not limited thereto. For example, the multi-step program operation may include three or more programming steps.

The memory area 114 may be programmed with data corresponding to a final distribution by the one-step program operation or with data corresponding to a final distribution by the multi-step program operation.

In FIG. 5, there is illustrated an example where data corresponding to all program states P11 to P17 is programmed in the coarse program operation. However, the inventive concept is not limited thereto. For example, data corresponding to a part of the program states P11 to P17 can be programmed in the coarse program operation.

Figure 6:
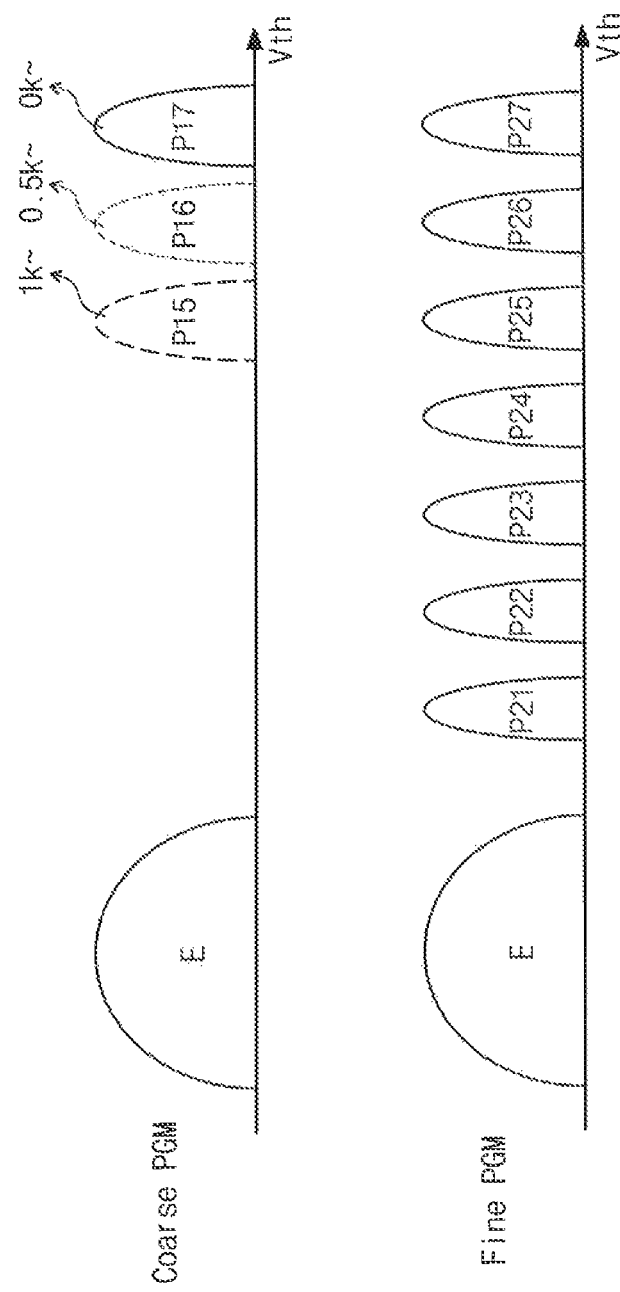
FIG. 6 is a diagram illustrating threshold voltage distributions formed in a coarse program operation according to an exemplary embodiment of the inventive concept.

FIG. 6 is a diagram illustrating threshold voltage distributions formed in a coarse program operation according to an exemplary embodiment of the inventive concept. Referring to FIG. 6, only data corresponding to a seventh program state P17 may be programmed in a coarse program operation.

In general, if a P/E cycle number of a memory block increases, a width of a threshold voltage distribution indicating a cell characteristic may become wider or dropped. In other words, if a P/E cycle number of a memory block increases, a threshold voltage distribution may become bad as compared to an initial value and the probability that an error is generated may become high. If coarse programming is executed every program operation to reduce the incidence of error, the performance of programming may be deteriorated. With an exemplary embodiment of the inventive concept, the number of program states formed in a coarse program operation may be changed according to a P/E cycle number. In addition, if a P/E cycle value is an initial value, the fine program operation may be directly performed without execution of the coarse program operation.

In exemplary embodiments of the inventive concept, if a P/E cycle number increases, the number of program states formed in the coarse program operation may increase. For example, as illustrated in FIG. 6, when a P/E cycle number is below 0.5 k (e.g., 0 k), only data corresponding to the seventh program state P17 may be programmed in the coarse program operation. In a case where a P/E cycle number is between 0.5 k and 1 k, only data corresponding to sixth and seventh program states P16 and P17 may be programmed in the coarse program operation. If a P/E cycle number is over 1 k, only data corresponding to fifth to seventh program states P15 to P17 may be programmed in the coarse program operation.

In exemplary embodiments of the inventive concept, since some states are programmed, the input/output circuit 130 (refer to FIG. 1) may fetch not just three pages of data from the buffer area 112 (refer to FIG. 1), but data remapped on two pages of data, and then, the coarse program operation may be performed.

With the coarse program operation according to an exemplary embodiment of the inventive concept, program states may be added starting from the uppermost program state P17, based on a P/E cycle number.

Threshold voltage distributions respectively corresponding to the program states P11 to P17 formed by the coarse program operation may have the same width. However, the inventive concept is not limited thereto. Widths of threshold voltage distributions respectively corresponding to the program states P11 to P17 formed by the coarse program operation may be different from one another.

Figure 7:
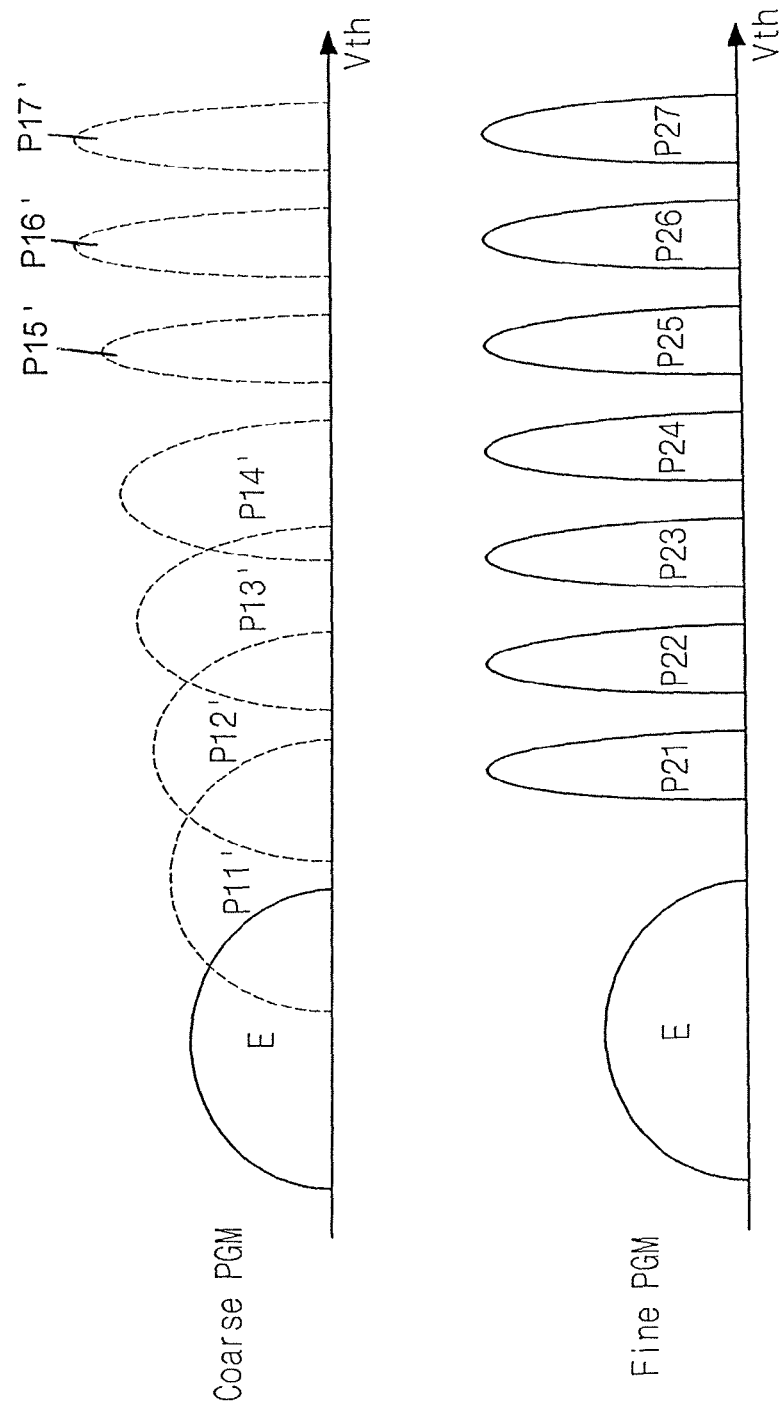
FIG. 7 is a diagram illustrating threshold voltage distributions formed in a coarse program operation according to an exemplary embodiment of the inventive concept.

FIG. 7 is a diagram illustrating threshold voltage distributions formed in a coarse program operation according to an exemplary embodiment of the inventive concept. Referring to FIG. 7, widths of threshold voltage distributions may become narrow from the lowermost program state P11' toward the uppermost program state P17'.

Program states may be divided into a first group including first and second program states P11' and P12', a second group including third and fourth program states P13' and P14', and a third group including fifth to seventh program states P15', P16' and P17'.

Grouping of threshold voltage distributions may be based on a distribution width. A distribution width may vary according to an increment of a program pulse applied in a program operation. Here, distribution widths in program states belonging to the third group may be narrower than that belonging to the first and second groups.

In exemplary embodiments of the inventive concept, a width of a threshold voltage distribution in a coarse program operation may be determined by a voltage difference between a verification level of a current program state and a verification level of a next program state.

In FIG. 7, widths of threshold voltage distributions may become narrow from the lowermost program state P11' toward the uppermost program state P17'. However, the inventive concept is not limited thereto. In a coarse program operation, a width of a threshold voltage distribution corresponding to at least one program state may be narrower than that corresponding to another program state. With the coarse program operation according to an exemplary embodiment of the inventive concept, when approaching the uppermost program state P17', a width of a threshold voltage distribution may become narrow.

A 3-bit program operation has been described with reference to FIGS. 5 to 7. However, the inventive concept is not limited thereto. The inventive concept is applicable to a 4-bit program operation.

Figure 8:
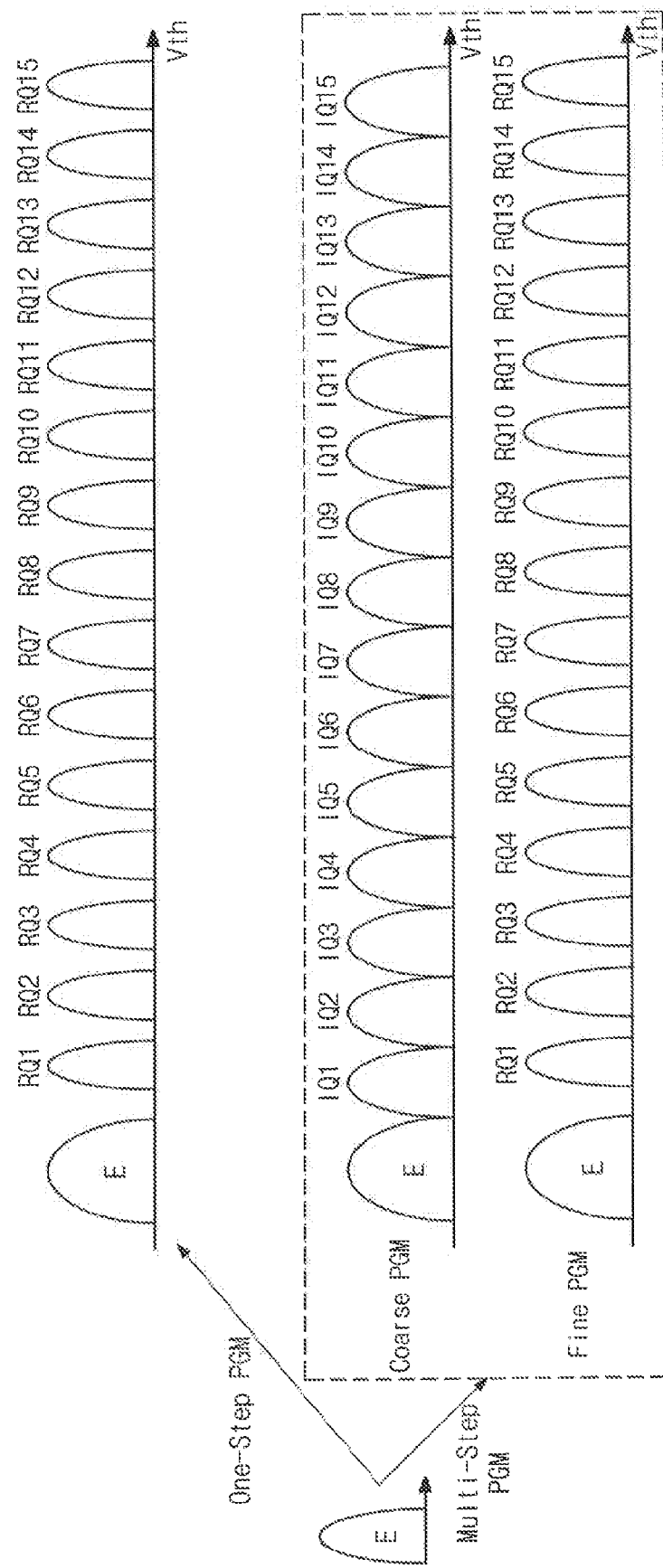
FIG. 8 is a diagram illustrating threshold voltage distributions of programmed memory cells of a memory area in FIG. 1 according to an exemplary embodiment of the inventive concept.

FIG. 8 is a diagram illustrating threshold voltage distributions of programmed memory cells of the memory area 114 in FIG. 1 according to an exemplary embodiment of the inventive concept. In FIG. 8, a 4-bit program operation may be applied to memory cells. Thus, memory cells may be programmed to have one of 16 threshold voltage distributions. For example, in the one-step program operation memory cells may have threshold voltage distributions RQ1 to RQ15. In the coarse program operation of the multi-step program operation, memory cells may have threshold voltage distributions IQ1 to IQ15, and in the fine program operation of the multi-step program operation, memory cells may have the threshold voltage distributions RQ1 to RQ15.

A coarse program operation may be performed such that a width of a threshold voltage distribution corresponding to an upper program state becomes narrower than that corresponding to a lower program state. This will be more fully described later.

Figure 9:
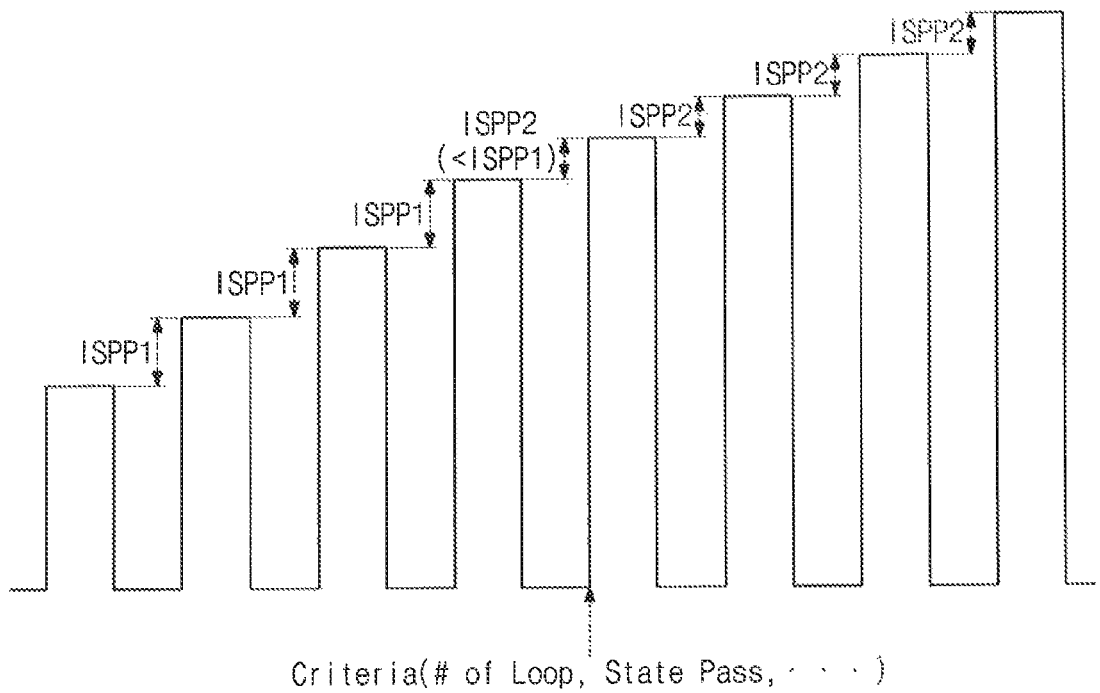
FIG. 9 is a diagram illustrating program loops of a coarse program operation according to an exemplary embodiment of the inventive concept.

FIG. 9 is a diagram illustrating program loops of a coarse program operation according to an exemplary embodiment of the inventive concept. Referring to FIG. 9, an increment of a program pulse may be reduced from ISPP1 to ISPP2 (ISPP2<ISPP1) from a predetermined program loop of a coarse program operation. In other words, the increment of the program pulse ISPP1 may be reduced after the predetermined program loop. Here, the predetermined program loop may be based on the number of program loops, information indicating whether the number of off cells detected is over a predetermined value, information indicating whether a particular state is passed, and so on Criteria(# of Loop, State Pass, . . . ).

In FIG. 9, there is illustrated an example where an increment of a program pulse is changed once. However, the inventive concept is not limited thereto. For example, an increment of a program pulse can be changed at program loops of the coarse program operation, respectively.

Figure 10:
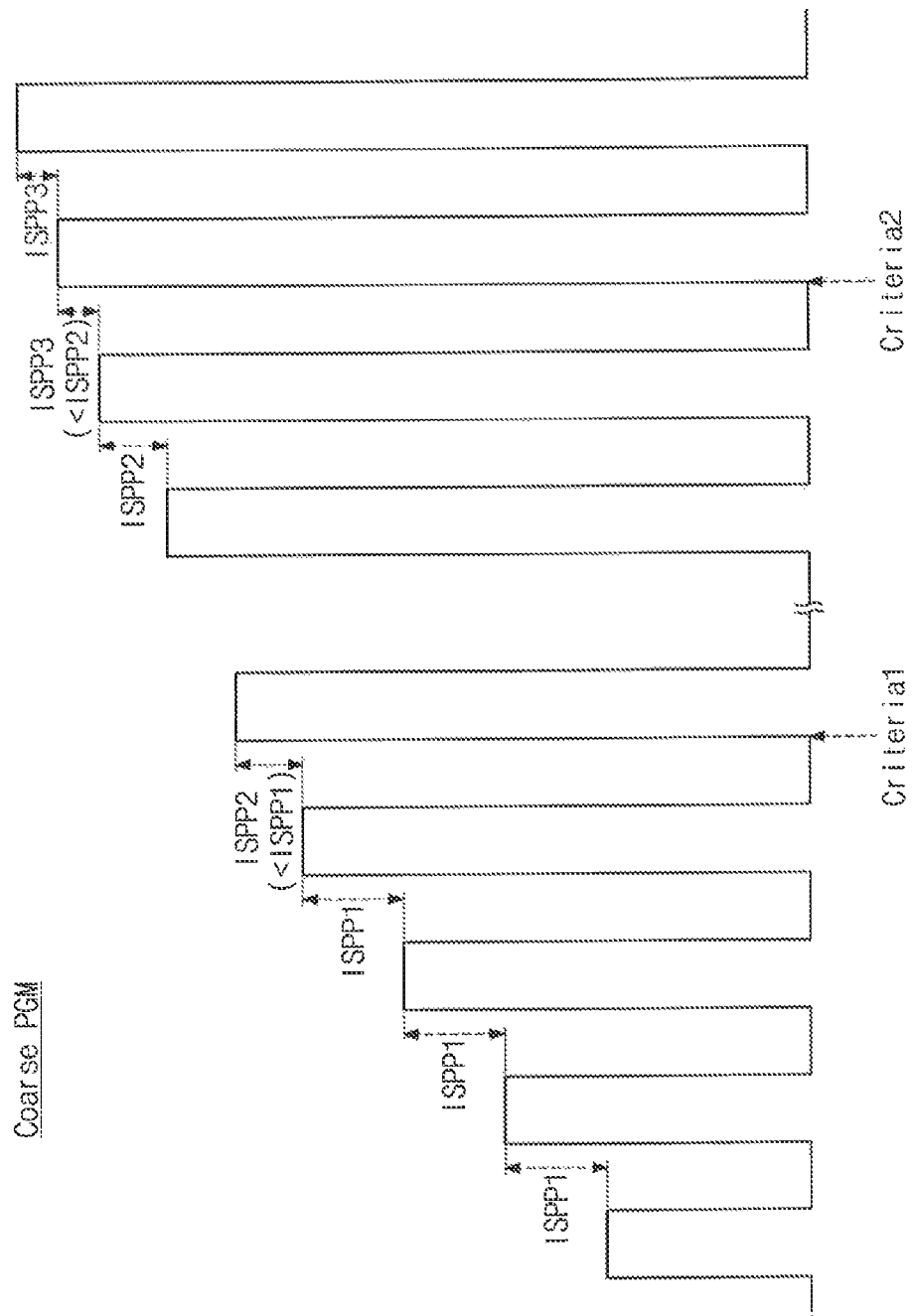
FIG. 10 is a diagram illustrating program loops of a coarse program operation according to an exemplary embodiment of the inventive concept.

FIG. 10 is a diagram illustrating program loops of a coarse program operation according to an exemplary embodiment of the inventive concept. Referring to FIG. 10, an increment of a program pulse may be reduced from ISPP1 to ISPP2 (ISPP2<ISPP1) from a first predetermined program loop of a coarse program operation. In other words, the increment of the program pulse ISPP1 may be reduced after the first predetermined program loop. In addition, an increment of the program pulse may be reduced from ISPP2 to ISPP3 (ISPP3<ISPP2) from a second predetermined program loop of the coarse program operation. In other words, the increment of the program pulse ISPP2 may be reduced after the second predetermined program loop. Here, a first condition Criteria 1 for determining the first predetermined program loop and a second condition Criteria 2 for determining the second predetermined program loop may be based on the number of program loops, information indicating whether the number of off cells detected is over a predetermined value, information indicating whether a particular state is passed, and so on.

In FIGS. 9 and 10, the coarse program operation according to an exemplary embodiment of the inventive concept may include a plurality of sections each including program loops. An increment of a program pulse applied to program loops of a section may be different from that applied to program loops of another section.

In FIGS. 9 and 10, there is illustrated an example where an increment of a program pulse is changed. However, the inventive concept is not limited thereto. For example, the duration of a program pulse applied to program loops of the coarse program operation can be changed.

Figure 11:
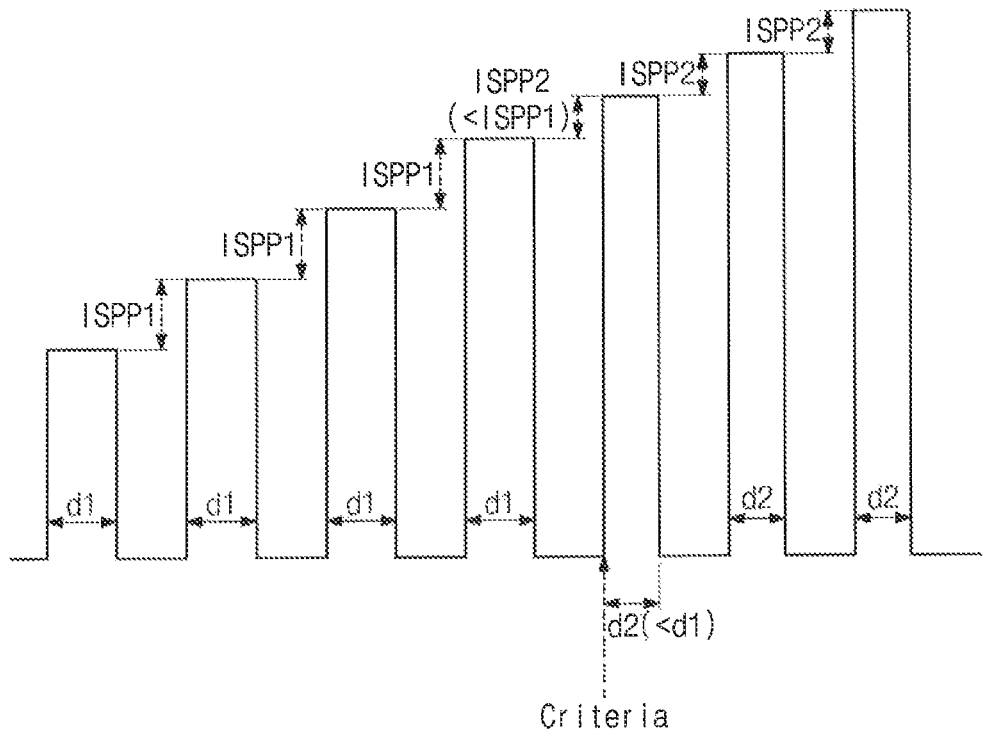
FIG. 11 is a diagram illustrating program loops of a coarse program operation according to an exemplary embodiment of the inventive concept.

FIG. 11 is a diagram illustrating program loops of a coarse program operation according to an exemplary embodiment of the inventive concept. Referring to FIG. 11, an increment of a program pulse may be reduced from ISPP1 to ISPP2 (ISPP2<ISPP1) from a first predetermined program loop Criteria of a coarse program operation Coarse PGM. In addition, a duration of the program pulse may be reduced from d1 to d2 (d2<d1) from the first predetermined program loop Criteria. In other words, the duration of the program pulse may be reduced after the first predetermined program loop.

The increment/duration of a program pulse applied to a program loop of the coarse program operation may not be limited to the examples shown in FIGS. 9 to 11. Changes or modifications to the increment/duration of a program pulse may be made. The increment/duration of a program pulse applied to a program loop of the coarse program operation may be changed based on the number of program loops, information indicating whether the number of off cells detected is over a predetermined value, information indicating whether a particular state is passed, and so on. With the above description, a width of a threshold voltage distribution may become narrow toward an upper program state.

A fine program operation according to an exemplary embodiment of the inventive concept may be executed under a condition that an increment/duration of a program pulse applied to a program loop is optimally selected to have a final state of a threshold voltage distribution.

Figure 12:
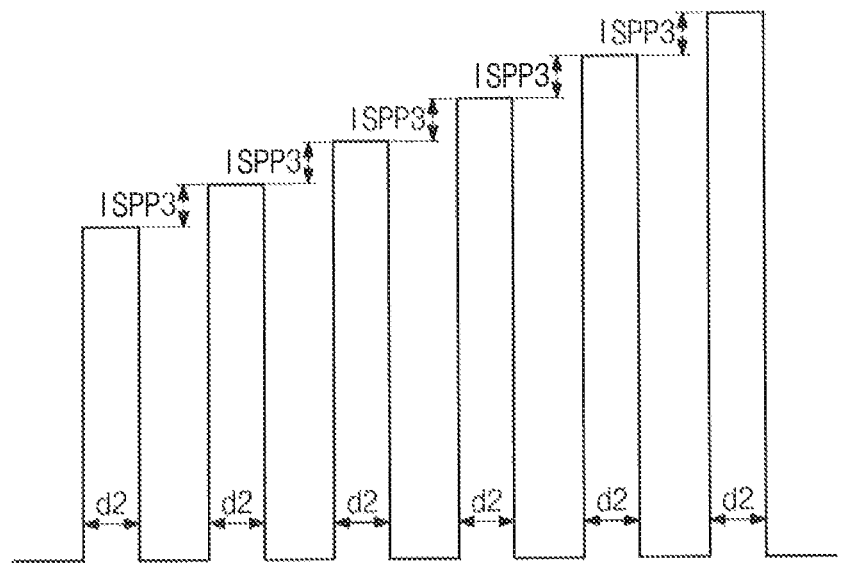
FIG. 12 is a diagram illustrating program loops of a fine program operation according to an exemplary embodiment of the inventive concept.

FIG. 12 is a diagram illustrating program loops of a fine program operation according to an exemplary embodiment of the inventive concept. Referring to FIG. 12, program loops of a fine program operation may be executed using an increment ISPP3 of a program pulse and duration d2. Although not shown, a verification step may include a coarse step and a fine step (in other words, a 2-step verification scheme can be used).

A coarse program operation according to an exemplary embodiment of the inventive concept may be performed differently according to an expected time of start of a fine program operation. In other words, a type of coarse program operation may be determined according to an expected time of start of a fine program operation. Here, the expected time of start of the fine program operation may be determined by an address scramble.

FIG. 13 is a diagram for describing an expected time of start of a fine program operation using an address scramble according to an exemplary embodiment of the inventive concept. Referring to FIG. 13, a horizontal axis of a table indicating an address scramble indicates string selection lines SSL1 to SSL4, and a vertical axis of the table indicates word lines WL1 to WL4. An intersection of a word line and a bit line indicates an address of a memory cell. For example, a location A may be a location of a memory cell arranged at an intersection of a first string selection line SSL1 and a second word line WL2, and a location B may be a location of a memory cell arranged at an intersection of a fourth string selection line SSL4 and a third word line WL3. A coarse program operation and a fine program operation may be sequentially performed with respect to memory cells placed at respective addresses.

In FIG. 13, for ease of description, it is assumed that an address scramble is performed in order such as ①→②→③→④→⑤→⑥→⑦→⑧. In other words, after a coarse program operation on a first word line WL1 is performed in a first step (①), a coarse program operation on a second word line WL2 may be performed in a second step (②). A fine program operation on the first word line WL1 may be performed in a third step (③), a coarse program operation on a third word line WL3 may be performed in a fourth step (④). Then, a fine program operation on the second word line WL2 may be performed in a fifth step (⑤).

Referring to the coarse program operation on the location A and the coarse program operation on the location B, expected start times of a fine program operation may be different. In the columns below Page Address, 0, 1, 2, 3, 4, 5, 6, 7, 8, 9, 10, 11, 12, 13, 14, 15, 16, 17, 18, 19, 20, 21, 22, 23, 24, 25, 26, 27, 32, 33, 34 and 35 refer to program operations. In the case of the location A, a coarse program operation (0) may be performed, and then, a fine program operation (8) may be performed after a time taken to perform seven coarse program operations (e.g., 1 to 7) elapses.

In the case of the location B, a coarse program operation (15) may be performed, and then, a fine program operation (27) may be performed after a time taken to perform four coarse program operations (e.g., 20 to 23) and seven fine program operations (e.g., 16 to 19 and 24 to 26) elapses.

Considering that a time taken to perform a coarse program operation is longer than that taken to perform a fine program operation, an expected time of start of a fine program operation after execution of a coarse program operation associated with the location B may be longer than an expected time of start of a fine program operation after execution of a coarse program operation associated with the location A.

The address scramble illustrated in FIG. 13 is exemplary. Modifications or changes to the address scramble may be variously made.

In an exemplary embodiment of the inventive concept, a type of coarse program operation may be determined based on such expected time. For example, if an expected time of start of a fine program operation is relatively longer, a coarse program operation may be performed such that a threshold voltage distribution is formed more finely as compared to that when an expected time of start of a fine program operation is relatively shorter (or such that it is approximate to a final distribution or such that it is similar to a distribution formed by a fine program operation).

In FIGS. 1 to 13, the storage device 10 may determine whether to use a reprogramming method according a cell status. However, the inventive concept is not limited thereto. The storage device 10 according to an exemplary embodiment of the inventive concept may perform reprogramming, and may determine a type of coarse program operation according to cell information.

Figure 14:
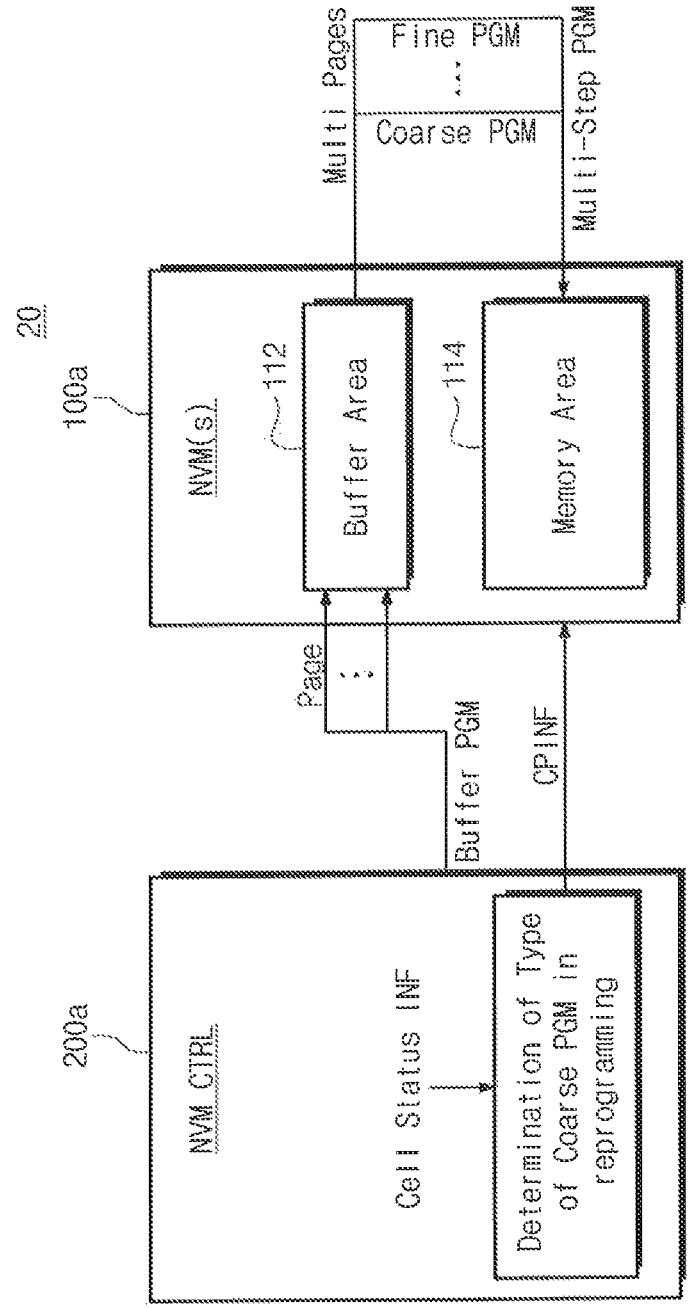
FIG. 14 is a block diagram illustrating a storage device according to an exemplary embodiment of the inventive concept.

FIG. 14 is a block diagram illustrating a storage device according to an exemplary embodiment of the inventive concept. Referring to FIG. 14, a storage device 20 may include at least one nonvolatile memory device 100a and a memory controller 200a for controlling the nonvolatile memory device 100a. The nonvolatile memory device 100a may be similar to the nonvolatile memory device 100 shown in FIG. 1. For example, Page which is input to the buffer area 112 may correspond to PD1 PDk in FIG. 1 and Multi Pages output from the buffer area 112 may correspond to PD1~PDk in FIG. 1.

The nonvolatile memory device 100a may perform a coarse program operation in different ways according to coarse program operation information CPINF. Here, the coarse program operation information CPINF may include type information associated with a coarse program operation.

The memory controller 200a may determine a type of coarse program operation Determination of Type of Coarse PGM in reprogramming based on cell status information, and may send the coarse program operation information CPINF to the nonvolatile memory device 100a based on the determination. In exemplary embodiments of the inventive concept, the cell information may be status information of a memory cell. In exemplary embodiments of the inventive concept, the cell information may be an expected time of start of a fine program operation.

The storage device 20 according to an exemplary embodiment of the inventive concept may determine a type of coarse program operation based on cell information.

Figure 15:
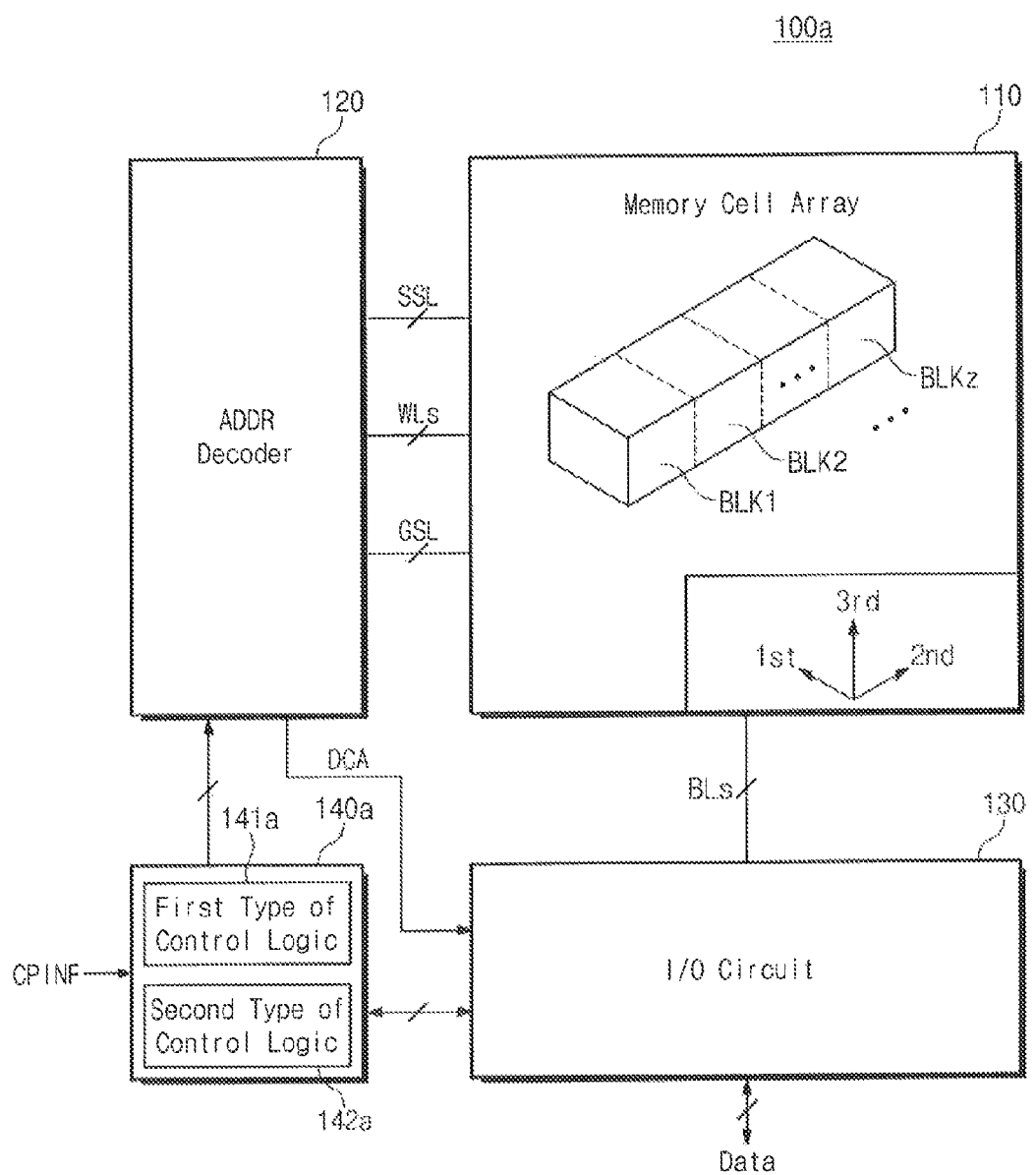
FIG. 15 is a block diagram illustrating a nonvolatile memory device of FIG. 14, according to an exemplary embodiment of the inventive concept.

FIG. 15 is a block diagram illustrating the nonvolatile memory device 100a of FIG. 14, according to an exemplary embodiment of the inventive concept. Referring to FIG. 15, the nonvolatile memory device 100a may be substantially the same as the nonvolatile memory device 100 of FIG. 2 except for control logic 140a. The control logic 140a may activate one of a first type of control logic 141a and a second type of control logic 142a according to coarse program operation information CPINF. In FIG. 15, there is illustrated an example where the control logic 140a includes the first type of control logic 141a for indicating a first type of coarse program operation and the second type of control logic 142a for indicating a second type of coarse program operation. However, the inventive concept is not limited thereto. For example, the number of types of coarse program operations may not be limited to this disclosure.

In FIGS. 1 to 15, at reprogramming, data may be buffered by the buffer area 112 of the nonvolatile memory device 100/100a. However, the inventive concept is not limited thereto. The inventive concept can be implemented to include a separate buffer memory for buffering data.

Figure 16:
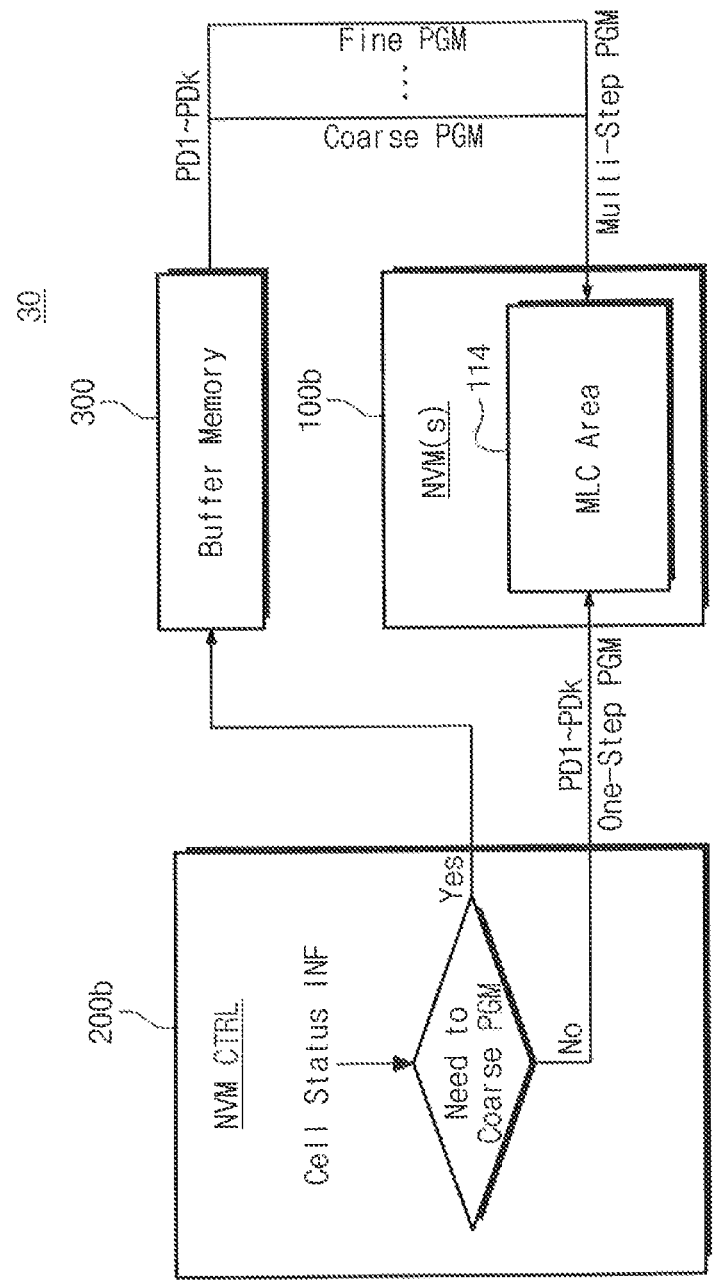
FIG. 16 is a block diagram illustrating a storage device according to an exemplary embodiment of the inventive concept.

FIG. 16 is a block diagram illustrating a storage device according to an exemplary embodiment of the inventive concept. Referring to FIG. 16, a storage device 30 may include at least one nonvolatile memory device 100b, a memory controller 200b, and a buffer memory 300.

The nonvolatile memory device 100b may include a memory area 114 which stores multi-bit data according to a one-step program operation or a multi-step program operation. The memory controller 200b may determine whether to perform a coarse program operation Need to Coarse PGM based on cell status information Cell Status INF. The buffer memory 300 may buffer data for the multi-step program operation when a coarse program operation is required Yes. No refers to a case when the coarse program operation is not required. The buffer memory 300 may be implemented by a random access memory such as a dynamic random access memory (DRAM), a static random access memory (SRAM), a PRAM or the like.

With the storage device 30 according to an exemplary embodiment of the inventive concept, data to be used for the multi-step program operation may be buffered by the buffer memory 300.

In FIG. 16, there is illustrated an example where the buffer memory 300 is placed outside the memory controller 200b. However, the inventive concept is not limited thereto. The memory controller 200b can be implemented to include the buffer memory 300.

Figure 17:
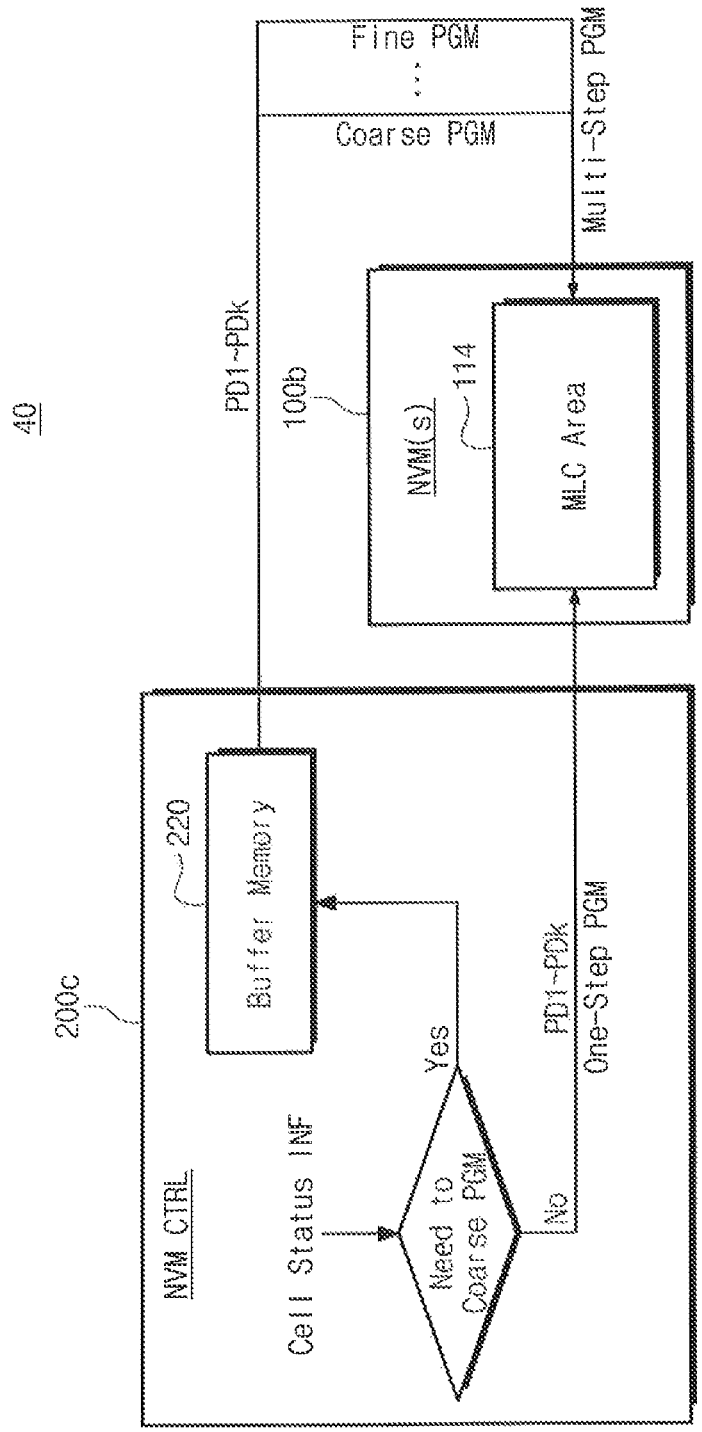
FIG. 17 is a block diagram illustrating a storage device according to an exemplary embodiment of the inventive concept.

FIG. 17 is a block diagram illustrating a storage device according to an exemplary embodiment of the inventive concept. Referring to FIG. 17, a storage device 40 may include at least one nonvolatile memory device 100b and a memory controller 200c. The nonvolatile memory device 100b may be similar to that shown in FIG. 16. The memory controller 200c may be similar to the memory controller 200b of FIG. 16 except that it includes a buffer memory 220 which is adapted to buffer data to be used in a multi-step program operation. The buffer memory 220 may be implemented by various types of volatile/nonvolatile memory devices.

Figure 18:
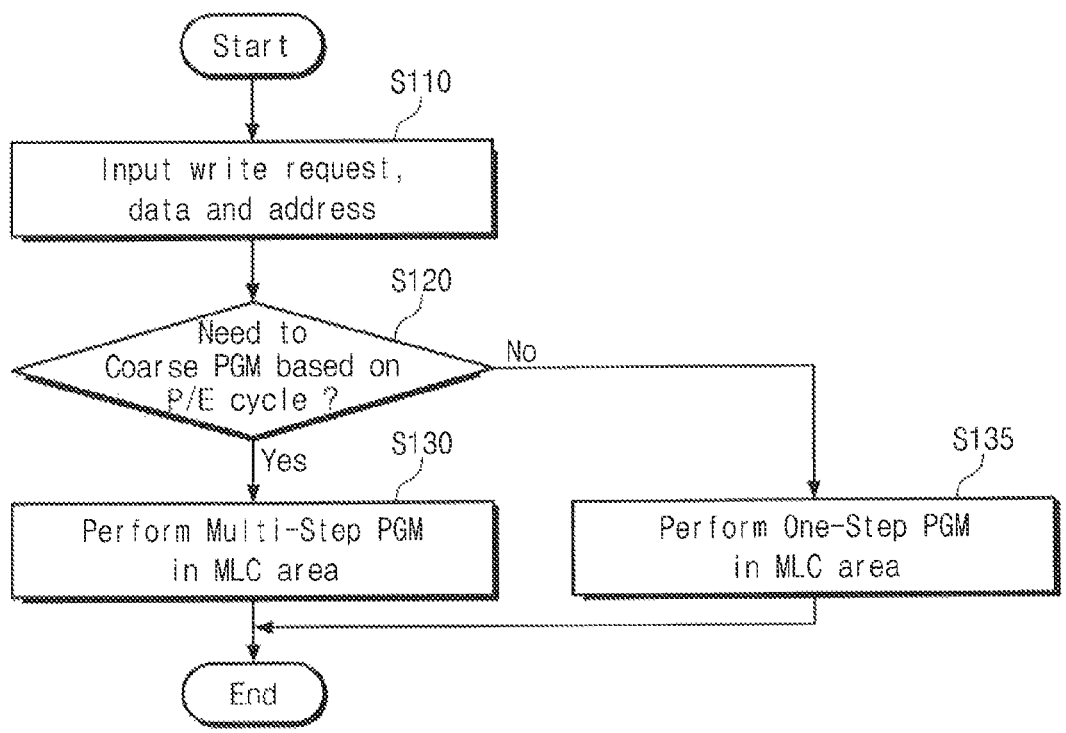
FIG. 18 is a flow chart illustrating a write method according to an exemplary embodiment of the inventive concept.

FIG. 18 is a flow chart illustrating a write method according to an exemplary embodiment of the inventive concept.

In operation S110, a write request, data and an address may be provided from an external host to the storage device 10 (refer to FIG. 1). In operation S120, the memory controller 200 (refer to FIG. 1) may check a P/E cycle value of a memory block of the nonvolatile memory device 100 (refer to FIG. 1) corresponding to the input address. The memory controller 200 may determine whether to perform a coarse program operation based on the checking result. For example, if a P/E cycle value checked is smaller than a predetermined value, a coarse program operation may be performed. If the coarse program operation is determined to be required, in operation S130, data may be stored in the memory area 114 (refer to FIG. 1) by performing a multi-step program operation. On the other hand, if the coarse program operation is determined not to be required, in operation S135, data may be stored in the memory area 114 by performing a one-step program operation.

With the write method according to an exemplary embodiment of the inventive concept, whether to store data using a multi-step program operation may be determined based on a P/E cycle value.

Figure 19:
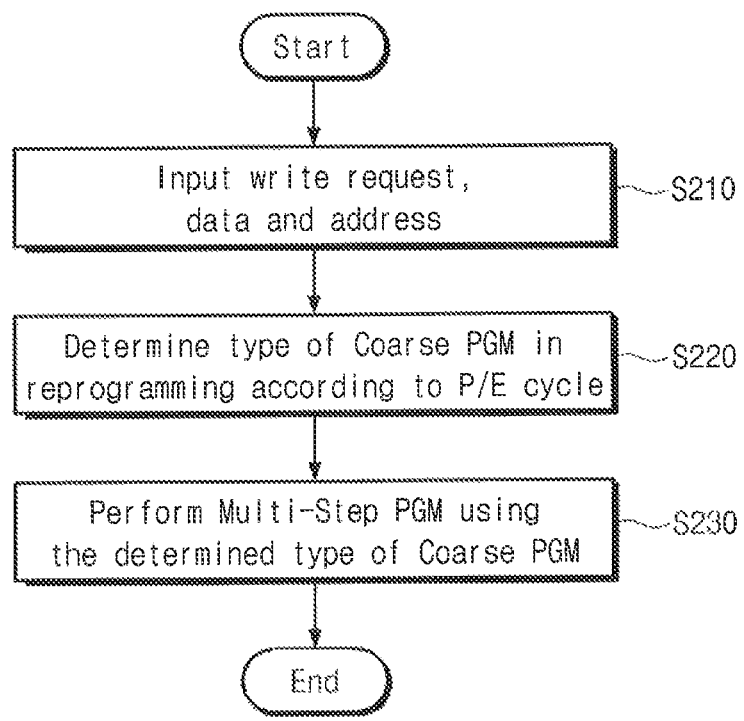
FIG. 19 is a flow chart illustrating a write method according to an exemplary embodiment of the inventive concept.

FIG. 19 is a flow chart illustrating a write method according to an exemplary embodiment of the inventive concept.

In operation S210, a write request, data and an address may be provided from an external host to the storage device 20 (refer to FIG. 14). In operation S220, the memory controller 200a (refer to FIG. 14) may check a P/E cycle value of a memory block of the nonvolatile memory device 100a (refer to FIG. 14) corresponding to the input address. The memory controller 200a may determine a type of coarse program operation based on the checking result. For example, if a P/E cycle value checked is larger than a predetermined value, in operation S220, a type of coarse program operation may be determined such that there is performed a coarse program operation to form a threshold voltage distribution similar to a final distribution of a fine program operation. In operation S230, data may be stored at the memory area 114 (refer to FIG. 14) by performing a multi-step program operation according to the type of coarse program operation thus determined.

With the write method according to an exemplary embodiment of the inventive concept, a type of coarse program operation may be determined based on a P/E cycle value, and a multi-step program operation may be performed according to the type of coarse program operation thus decided.

The inventive concept is applicable to a solid state drive (SSD).

Figure 20:
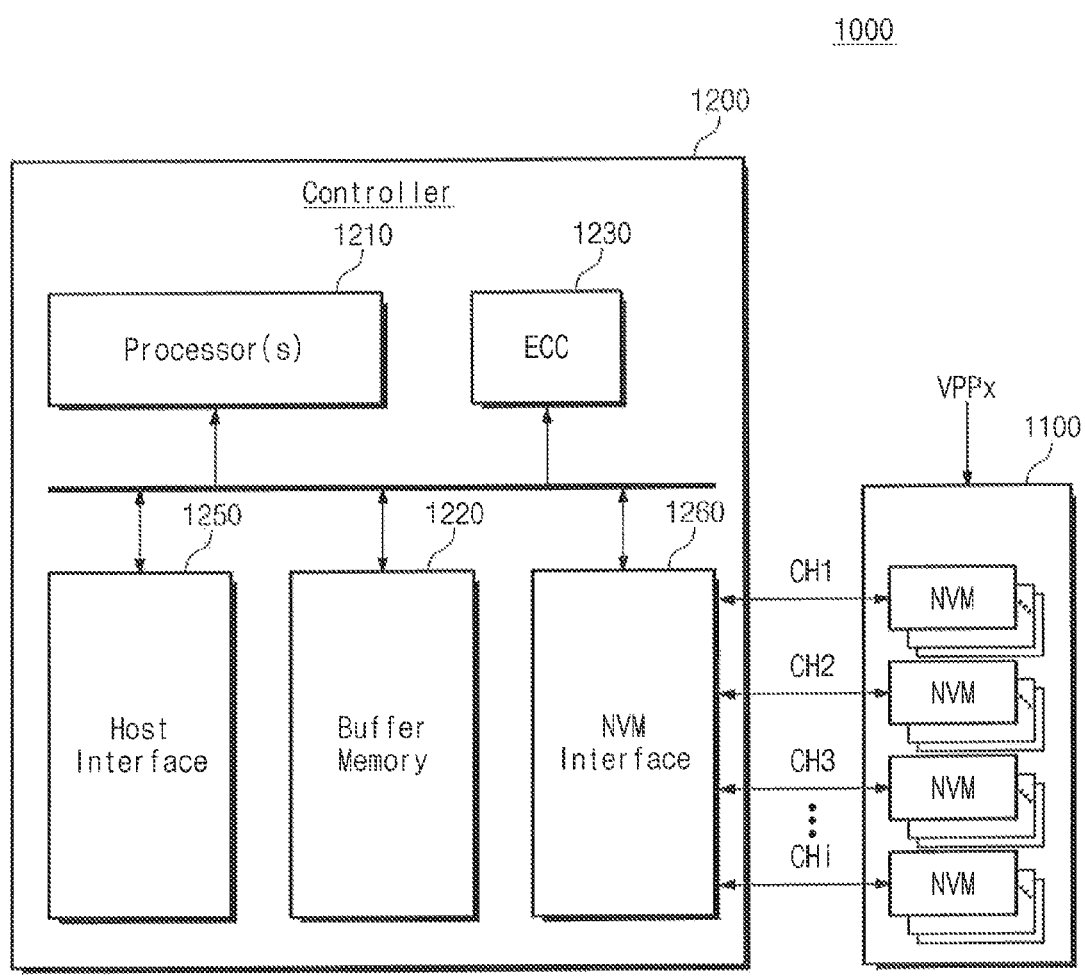
FIG. 20 is a block diagram illustrating a solid state drive according to an exemplary embodiment of the inventive concept.

FIG. 20 is a block diagram illustrating an SSD according to an exemplary embodiment of the inventive concept. Referring to FIG. 20, an SSD 1000 may include a plurality of nonvolatile memory devices 1100 and an SSD controller 1200.

The nonvolatile memory devices 1100 may be optionally supplied with an external high voltage VPPx. Each of the nonvolatile memory devices 1100 may perform a coarse program operation based on cell status information or cell information as described with reference to FIGS. 1 to 19.

The SSD controller 1200 may be connected to the nonvolatile memory devices 1100 through a plurality of channels CH1 to CHi (i being an integer of 2 or more). The SSD controller 1200 may include at least one processor 1210, a buffer memory 1220, an error correcting code (ECC) circuit 1230, a host interface 1250, and a nonvolatile memory interface 1260.

The buffer memory 1220 may be configured to temporarily store data needed to drive the memory controller 1200. In exemplary embodiments of the inventive concept, the buffer memory 1220 may store an error rate table ERT according to an operating condition. The buffer memory 1220 may include a plurality of memory lines for storing data or commands. Here, the plurality of memory lines may be mapped on cache lines in various methods.

The buffer memory 1220 may buffer data to be used in a fine program operation. In FIG. 20, there is illustrated an example where the SSD controller 1200 includes the buffer memory 1220. However, the inventive concept is not limited thereto. The buffer memory 1220 can be placed outside the SSD controller 1200.

The ECC circuit 1230 may calculate an ECC value of data to be programmed at a write operation. The ECC circuit 1230 may correct an error of data read at a read operation based on an ECC value. The ECC circuit 1230 may correct an error of recovered data of the nonvolatile memory devices 1100 in a data recovery operation. Although not shown, a code memory may be further provided which stores code data needed to drive the memory controller 1200. The code memory may be formed of a nonvolatile memory device.

The host interface 1250 may interface with an external device. The nonvolatile memory interface 1260 may interface with the nonvolatile memory devices 1100.

The SSD 1000 according to an exemplary embodiment of the inventive concept may improve a program speed and reliability of data by performing a coarse program operation based on cell status information or cell information at a write request.

The inventive concept is applicable to an eMMC (e.g., an embedded multimedia card (MMC), a moviNAND, an iNAND, etc.).

Figure 21:
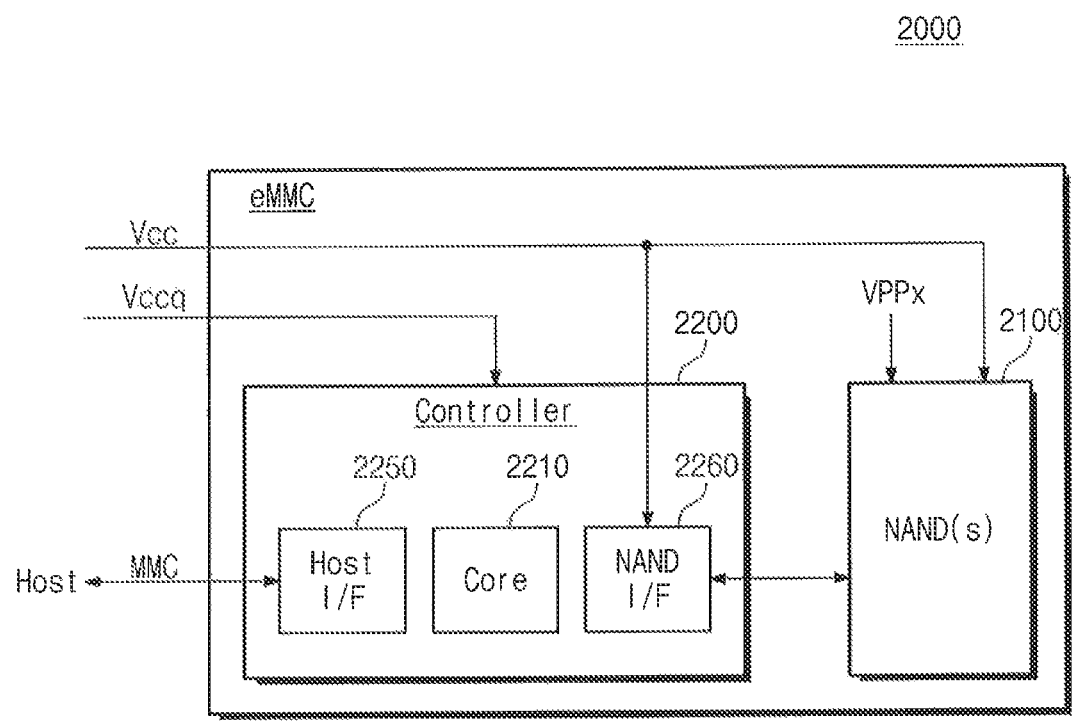
FIG. 21 is a block diagram illustrating an embedded multimedia card (eMMC) according to an exemplary embodiment of the inventive concept.

FIG. 21 is a block diagram illustrating an eMMC according to an exemplary embodiment of the inventive concept. Referring to FIG. 21, an eMMC 2000 may include at least one NAND flash memory device 2100 and a controller 2200.

The NAND flash memory device 2100 may be configured to perform a one-step program operation or a multi-step program operation.

The controller 2200 may be connected to the NAND flash memory device 2100 through a plurality of channels. The controller 2200 may include at least one controller core 2210, a host interface (I/F) 2250, and a NAND interface (I/F) 2260. The at least one controller core 2210 may control an overall operation of the eMMC 2000. The host interface 2250 may provide an interface between a host and the controller 2200. The NAND interface 2260 may provide an interface between the controller 2200 and the NAND flash memory device 2100. In exemplary embodiments of the inventive concept, the host interface 2250 may be a parallel interface (e.g., an MMC interface). In exemplary embodiments of the inventive concept, the host interface 2250 may be a serial interface (e.g., ultra high speed (UHS)-II, universal flash storage (UFS), etc.).

The memory controller 2200 may determine whether to perform a coarse program operation or a type of coarse program operation based on cell status information or cell information.

The eMMC 2000 may receive power supply voltages Vcc and Vccq from a host. Herein, the power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200. In exemplary embodiments of the inventive concept, the eMMC 2000 may be optionally supplied with an external high voltage.

To improve performance, the eMMC 200 according to an exemplary embodiment of the inventive concept may determine whether to perform a coarse program operation and a type of coarse program operation based on cell status information or cell information.

The inventive concept is applicable to UFS.

Figure 22:
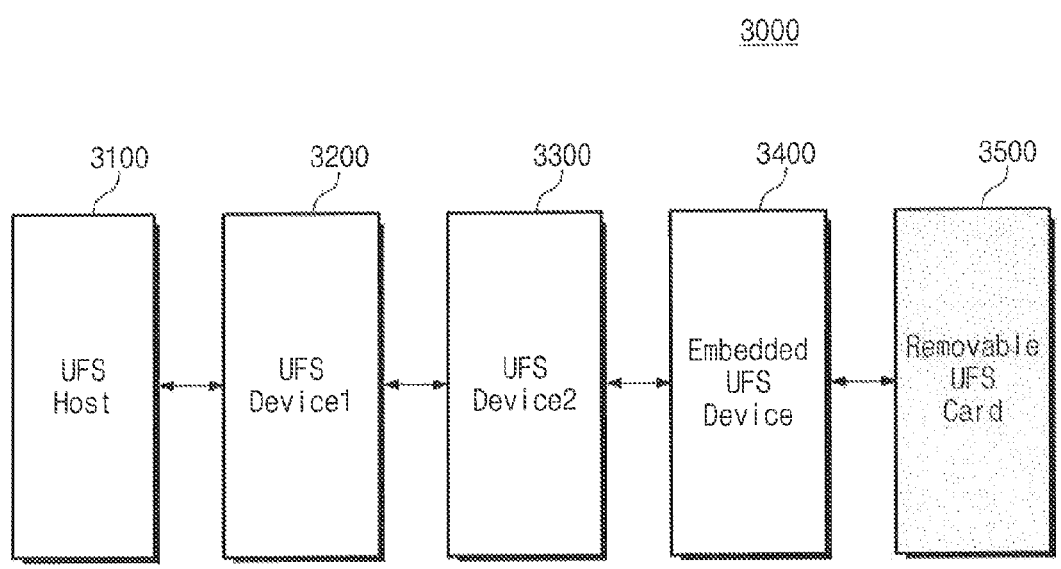
FIG. 22 is a block diagram illustrating a universal flash storage (UFS) system according to an exemplary embodiment of the inventive concept.

FIG. 22 is a block diagram illustrating a UFS system 3000 according to an exemplary embodiment of the inventive concept. Referring to FIG. 22, the UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented by one of storage devices 10, 20, 30 and 40 in FIGS. 1, 14, 16 and 17.

Further, the embedded UFS device 3400 and the removable UFS card 3500 may perform communications using protocols different from the UFS protocol. The UFS host 3100 and the removable UFS card 3500 may communicate through various card protocols (e.g., USB flash drive (UFD), MMC, secure digital (SD), mini SD, Micro SD, etc.).

The inventive concept is applicable to a mobile device.

Figure 23:
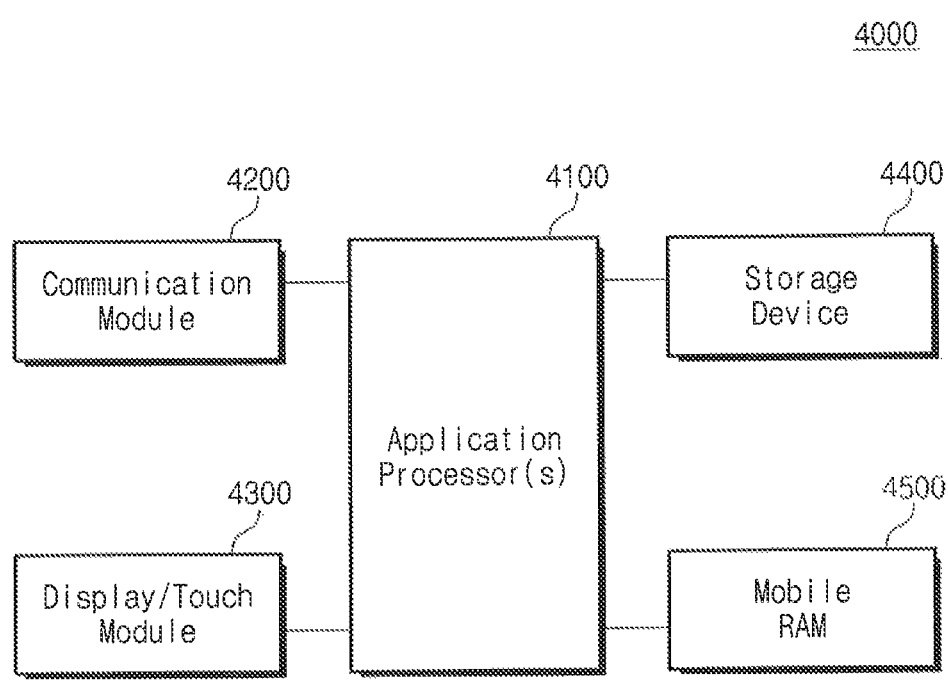
FIG. 23 is a block diagram illustrating a mobile device according to an exemplary embodiment of the inventive concept.

FIG. 23 is a block diagram illustrating a mobile device 4000 according to an exemplary embodiment of the inventive concept. Referring to FIG. 23, the mobile device 4000 may include an application processor 4100, a communication module 4200, a display/touch module 4300, a storage device 4400, and a mobile RAM 4500.

The application processor 4100 may control an overall operation of the mobile device 4000. The communication module 4200 may control wireless/wire communications with an external device. The display/touch module 4300 may display data processed by the application processor 4100 and receive data through a touch panel. The storage device 4400 may store user data. The storage device 4400 may be an eMMC, an SSD, a UFS device or the like. The storage device 4400 may determine whether to perform a coarse program operation or a type of coarse program operation based on cell status information or cell information as described with reference to FIGS. 1 to 19. The mobile RAM 4500 may be configured to temporarily store data needed for a process operation of the mobile device 4000.

The mobile device 4000 according to an exemplary embodiment of the inventive concept may improve performance by using the storage device 4400 performing an optimal program operation.

A memory system or a storage device according to an exemplary embodiment of the inventive concept may be packed using various types of packages. For example, a nonvolatile memory device or a memory controller according to an exemplary embodiment of the inventive concept may be packed using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been particularly shown and described with reference to exemplary embodiments thereof, it will be apparent to those of ordinary skill in the art that various changes in form and detail may be made thereto without departing from the spirit and scope of the present inventive concept as defined by the claims.

What is claimed is:

1. A write method of a storage device, comprising:
  determining whether to perform a coarse program operation based on information about memory cells of a memory device,
  in response to a determination that the coarse program operation is to be performed, programming data in the memory device by performing the coarse program operation and a fine program operation, and
  in response to a determination that the coarse program operation is not to be performed, programming data in the memory device by performing the fine program operation,
  wherein a range of a threshold voltage distribution near an upper program state is narrower than a range of a threshold voltage distribution near a lower program stage in the coarse program operation.

2. The write method of claim 1, wherein the information about memory cells of the memory device includes program/erase cycle information, wear-leveling information, or information indicating whether a memory cell is programmed.

3. The write method of claim 1, wherein the determination is made by a memory controller.

4. The write method of claim 1, wherein the data programmed in the coarse program operation is provided via a first signal line to a buffer area.

5. The write method of claim 4, wherein the buffer area is included in the memory device, a memory controller, or is separate from the memory device and the memory controller.

6. The write method of claim 4, wherein the data programmed in the fine program operation is provided via a second signal line to a memory area of the memory device.

7. The write method of claim 1, wherein a memory controller provides the memory device with an instruction whether to perform the coarse program operation and the fine program operation, or perform only the fine program operation.

8. The write method of claim 1, wherein the memory device is a nonvolatile memory.

9. The write method of claim 8, wherein the nonvolatile memory has a three-dimensional vertical array structure.

10. The write method of claim 1, wherein the determination is made in response to a write request.

11. The write method of claim 1, wherein a number of program states in the coarse program operation is based on a program/erase cycle number.

12. A write method of a storage device, comprising:
  receiving a write request at a memory controller;
  determining, at the memory controller, whether to perform a coarse program operation based on information about memory cells corresponding to the write request;
  wherein when the information about the memory cells is between an initial state and a first threshold, the coarse program operation is determined not to be performed; and
  when the information about the memory cells is between the first threshold and a second threshold, the coarse program operation is determined to be performed and data is programmed in the memory cells by performing the coarse program operation and a fine program operation,
  wherein the information about the memory cells indicates a program/erase cycle number of the memory cells.

13. The write method of claim 12, wherein the program/erase cycle number of the first threshold is less than the program/erase cycle number of the second threshold.

14. The write method of claim 13, wherein data corresponding to an upper program state is programmed during the coarse program operation and data corresponding to a lower program state is not programmed during the coarse program operation.

15. The write method of claim 14, wherein when the information about the memory cells exceeds the second threshold, the coarse program operation is determined to be performed and data is programmed in the memory cells by performing the coarse program operation.

16. The write method of claim 15, wherein the program/erase cycle number of the memory cells is greater than the second threshold when the information about the memory cells exceeds the second threshold.

17. The write method of claim 15, wherein data corresponding to all program states is programmed during the coarse program operation performed when the program/erase cycle number of memory cells exceeds the second threshold.

18. The write method of claim 12, wherein a range of a threshold voltage distribution near an upper program state is narrower than a range of a threshold voltage distribution near a lower program stage in the coarse program operation.

19. A write method of a storage device, comprising:
receiving a write request for an address at a memory controller;
determining, at the memory controller, a type of coarse program operation to be performed on a memory cell associated with the address, wherein the type of coarse program operation is based on an expected time of start of a fine program operation after execution of the coarse program operation; and
outputting, from the memory controller to a memory device, an instruction to perform the determined type of coarse program operation.

20. The write method of claim 19, wherein threshold voltage distributions in a first type coarse program operation are narrow when the expected time is short and threshold voltage distributions in a second type coarse program operation are wide when the expected time is long.

21. A write method of a storage device, comprising:
determining a type of coarse program operation to be performed based on information about memory cells of a memory device; and
in response to determining the type of coarse program operation to be performed, programming data in the memory device by performing the determined type of coarse program operation and a fine program operation, wherein an increment of a voltage level of a program pulse in the coarse program operation is reduced.

22. The write method of claim 21, wherein a number of program states formed in the coarse program operation increases as a program/erase cycle increases.

23. The write method of claim 21, wherein a range of a threshold voltage distribution near a lower program state is narrower than a range of a threshold voltage distribution near an upper program state in the coarse program operation.

24. The write method of claim 21, wherein program states of the coarse program operation are divided into a plurality of groups.

25. The write method of claim 24, wherein the program states are grouped according to ranges of their threshold voltage distributions.

26. A write method of a storage device, comprising:
determining a type of coarse program operation to be performed based on information about memory cells of a memory device; and
in response to determining the type of coarse program operation to be performed, programming data in the memory device by performing the determined type of coarse program operation and a fine program operation, wherein a duration between program pulses in the coarse program operation is different.

* * * * *